(12) United States Patent
Tsai et al.

(10) Patent No.: US 10,163,647 B2
(45) Date of Patent: Dec. 25, 2018

(54) METHOD FOR FORMING DEEP TRENCH STRUCTURE

(71) Applicant: Taiwan Semiconductor Manufacturing Co., Ltd., Hsinchu (TW)

(72) Inventors: Min-Ying Tsai, Kaohsiung (TW); Cheng-Ta Wu, Shueishang Township, Chiayi County (TW); Yeur-Luen Tu, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/416,733

(22) Filed: Jan. 26, 2017

(65) Prior Publication Data

US 2018/0166293 A1    Jun. 14, 2018

Related U.S. Application Data

(60) Provisional application No. 62/433,531, filed on Dec. 13, 2016.

(51) Int. Cl.
| | |
|---|---|
| *H01L 21/308* | (2006.01) |
| *H01L 21/3065* | (2006.01) |
| *H01L 49/02* | (2006.01) |
| *H01L 27/146* | (2006.01) |

(52) U.S. Cl.
CPC .... *H01L 21/30655* (2013.01); *H01L 21/3081* (2013.01); *H01L 21/3085* (2013.01); *H01L 27/1463* (2013.01); *H01L 27/1464* (2013.01); *H01L 27/14621* (2013.01); *H01L 27/14627* (2013.01); *H01L 27/14632* (2013.01); *H01L 27/14636* (2013.01); *H01L 27/14645* (2013.01); *H01L 27/14687* (2013.01); *H01L 28/60* (2013.01)

(58) Field of Classification Search
None
See application file for complete search history.

(56) References Cited

U.S. PATENT DOCUMENTS

| | | | | |
|---|---|---|---|---|
| 2003/0017710 | A1* | 1/2003 | Yang | H01L 21/76232 |
| | | | | 438/718 |
| 2010/0187602 | A1* | 7/2010 | Woolsey | H01L 21/28229 |
| | | | | 257/330 |
| 2017/0162554 | A1* | 6/2017 | Clevenger | H01L 25/18 |

* cited by examiner

*Primary Examiner* — Bradley Smith
(74) *Attorney, Agent, or Firm* — Birch, Stewart, Kolasch & Birch, LLP

(57) ABSTRACT

A method for forming a deep trench structure is provided. The method includes forming a first recess in a top portion of a substrate and forming a first protective layer on sidewalls of the first recess. The method includes etching a middle portion of the substrate by using the first protective layer as a mask to form a second recess and forming a second protective layer on sidewalls of the second recess. The method also includes etching a bottom portion of the substrate by using the second protective layer as a mask to form a third recess; and removing the first protective layer and the second protective layer to form a deep trench structure. The deep trench structure is constructed by the first recess, the second recess and the third recess, and the deep trench structure has a stair shape.

20 Claims, 26 Drawing Sheets

METHOD FOR FORMING DEEP TRENCH STRUCTURE

CROSS REFERENCE TO RELATED APPLICATIONS

This Application claims the benefit of U.S. Provisional Application No. 62/433,531, filed on Dec. 13, 2016, and entitled "Method for forming deep trench structure", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

Deep trenches have been used for several purposes in semiconductor devices, such as using as capacitor structures or isolation structures. A deep trench structure is created in a semiconductor substrate by several fabricating processes which may include etching processes, patterning processes and/or filling processes.

Although existing deep trench structures and methods for forming the same have been generally adequate for their intended purposes they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1F' shows a cross-sectional representation of the deep trench structure after the first protection layer and the second protection layer are removed in another embodiment.

DETAILED DESCRIPTION

Figure 1A:
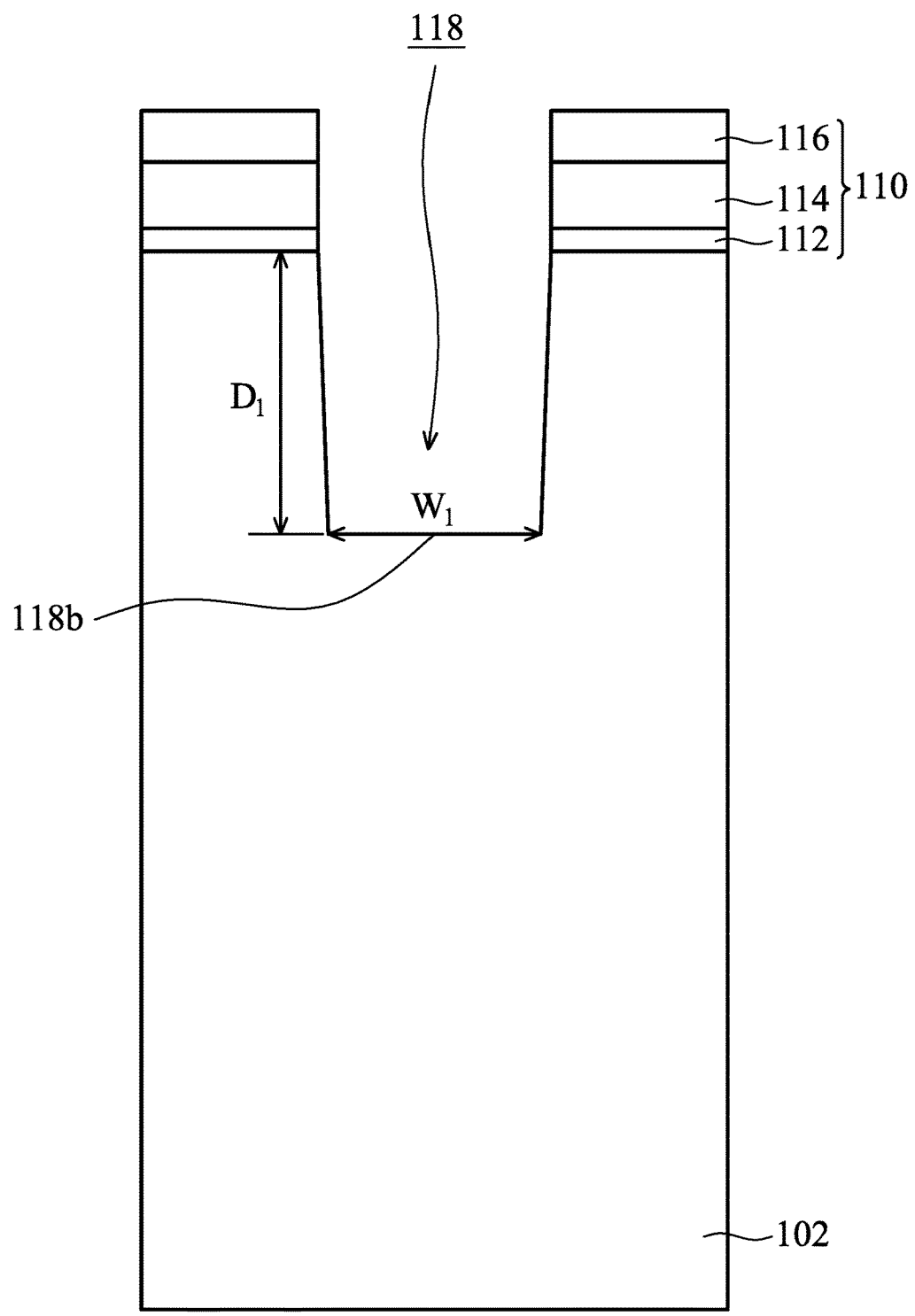
FIGS. 1A-1G show cross-sectional representations of various stages of forming a deep trench structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for a deep trench structure and method for forming the same are provided. FIGS. 1A-1G show cross-sectional representations of various stages of forming a deep trench structure 10a, in accordance with some embodiments of the disclosure.

Referring to FIG. 1A, a substrate 102 is provided. The substrate 102 may be made of silicon or other semiconductor materials. In some embodiments, the substrate 102 is a wafer. Alternatively or additionally, the substrate 102 may include other elementary semiconductor materials such as germanium. In some embodiments, the substrate 102 is made of a compound semiconductor or alloy semiconductor, such as silicon carbide, gallium arsenic, indium arsenide, or indium phosphide, silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

A hard mask layer 110 is formed on the substrate 102. The hard mask layer 110 includes multiple layers. The hard mask layer 110 may be made of a dielectric material. In some embodiments, the hard mask layer 110 includes a first oxide mask layer 112, a nitride mask layer 114 and a second oxide mask layer 116. The first oxide mask layer 112 and the second oxide mask layer 116 may be silicon oxide, and the nitride mask layer 114 may be silicon nitride. In some other embodiments, the hard mask layer 110 includes two layers of the first oxide mask layer 112 and the nitride mask layer 114. In some other embodiments, the hard mask layer 110 includes more than three layers.

The hard mask layer 110 is patterned by a patterning process. The patterning process includes a photolithography process and an etching process. The photolithography process includes photoresist coating (e.g., spin-on coating), soft baking, mask aligning, exposure, post-exposure baking, developing the photoresist, rinsing, and drying (e.g., hard baking). The etching process includes a dry etching process or a wet etching process. In some embodiments, a photoresist layer (not shown) is formed on the hard mask layer 110, and then the photoresist layer is patterned to form a patterned photoresist layer. Afterwards, the hard mask layer 110 is patterned by using the patterned photoresist layer as a mask to form a patterned hard mask layer 110.

Next, a portion of the substrate 102 is removed by using the patterned hard mask layer 110 as a mask to form a first recess 118. The first recess 118 has a first bottom surface 118b with a first width $W_1$ and a first depth $D_1$. The first depth $D_1$ is measured from a top surface of the substrate 102 to the bottom surface 118b of the first recess 118. The first recess 118 has opposite sidewalls, and the sidewalls are sloped to the bottom surface 118b.

Figure 1B:
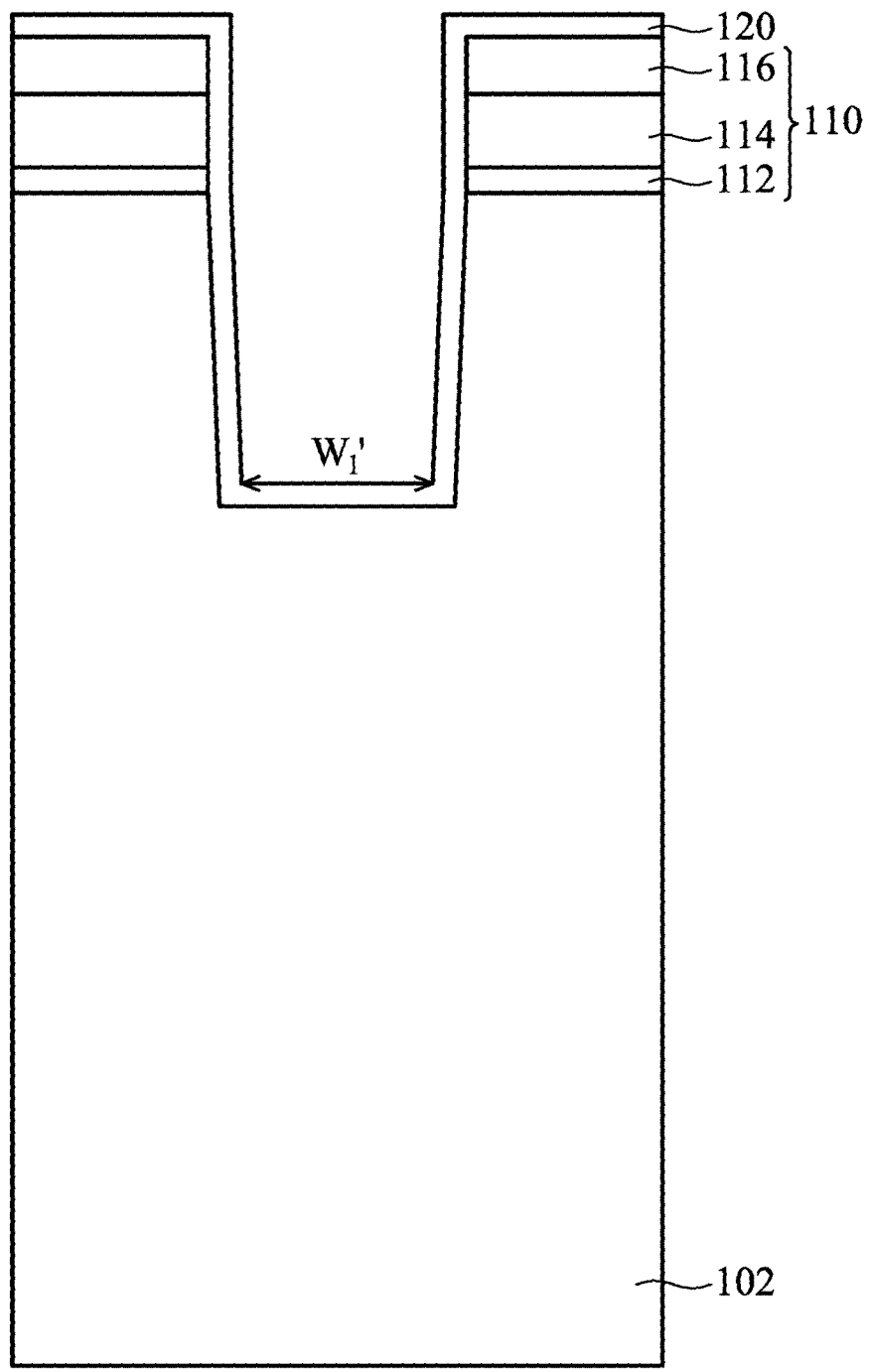

Afterwards, as shown in FIG. 1B, a first protective layer 120 is formed on sidewalls and a bottom surface of the first recess 118, in accordance with some embodiments of the disclosure. In addition, the first protective layer 120 is formed on a top surface of the hard mask layer 110. The first protective layer 120 is configured to protect the underlying substrate 102 from being etched in a subsequent process.

In some embodiments, the first protective layer 120 is made of oxide or nitride. In some embodiments, the first protective layer 120 is made of silicon oxide (SiOx). In some other embodiments, the first protective layer 120 is made of silicon nitride (SixNy).

In some embodiments, the first protective layer 120 is formed by a deposition process, such as a chemical vapor deposition (CVD) process, an atomic layer deposition (ALD) process, or another applicable process. In some embodiments, the first protective layer 120 has a thickness in a range from about 5 nm to about 20 nm. Because the first recess 118 is partially filled with the first protective layer 120, therefore the first width $W_1$ of the first bottom surface 118b of the first recess 118 is reduced after the first protective layer 120 is formed. After the first protective layer 120 is formed, the bottom surface 118b of the first recess 118 has a narrowed first width $W_1'$ that is smaller than the first width $W_1$.

Figure 1C:
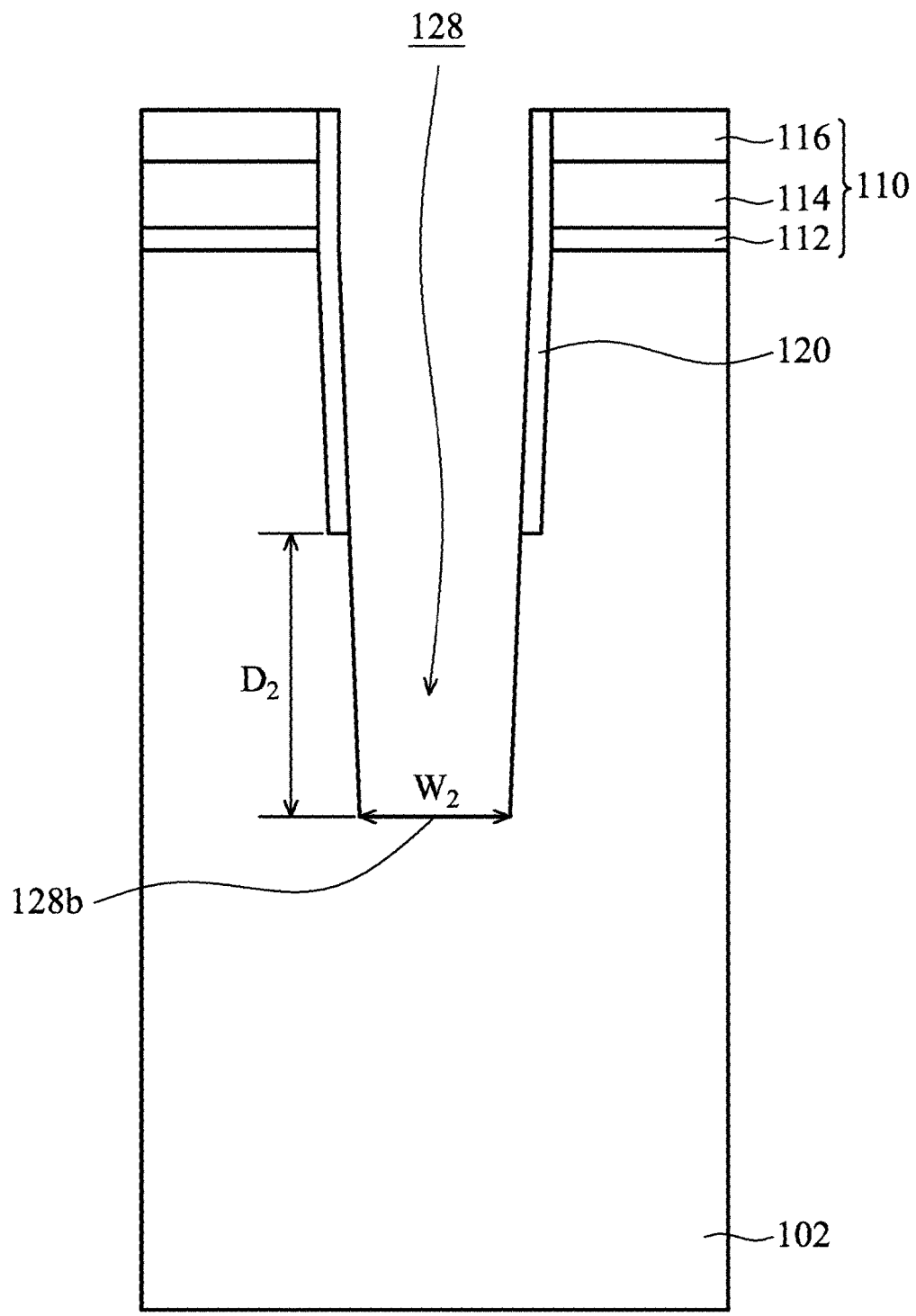

Afterwards, as shown in FIG. 1C, a bottom portion of the first protective layer 120 is removed, and a portion of the substrate 102 below the first recess 118 is removed by using the hard mask layer 110 and the first protective layer 120 as a mask, in accordance with some embodiments of the disclosure. In addition, the top portion of the first protective layer 120 which is on the hard mask layer 110 is removed. As a result, a second recess 128 below the first recess 118 is obtained.

It should be noted that the sidewalls of the hard mask layer 110, and the sidewalls of the substrate 102 which are protected or covered by the first protective layer 120 are not removed. Therefore, the second recess 128 has a second bottom surface 128b with a second width $W_2$ and a second depth $D_2$ and the second width $W_2$ is smaller than the first width $W_1$.

In some embodiments, the portion of the substrate 102 below the first recess 118 is removed by an etching process, such as a dry etching process. A portion of the substrate 102 is removed by the etching process, but another portion of the substrate 102 which is covered by the first protective layer 120 is not removed by the etching process. The etching process provides a high selectivity toward the substrate 102 and the first protective layer 120. More specifically, the etching rate of the substrate 102 in the etching process is higher than the etching rate of the first protective layer 120. At the beginning of the etching process, since the etching rate along the vertical direction is higher than the etching rate along the lateral direction, a bottom portion of the first protective layer 120 is firstly etched to form an exposed substrate 102. Afterwards, since the etching rate of the substrate 102 and the etching rate of the first protective layer is different, the exposed substrate 102 is etched to form the second recess 128.

Figure 1D:
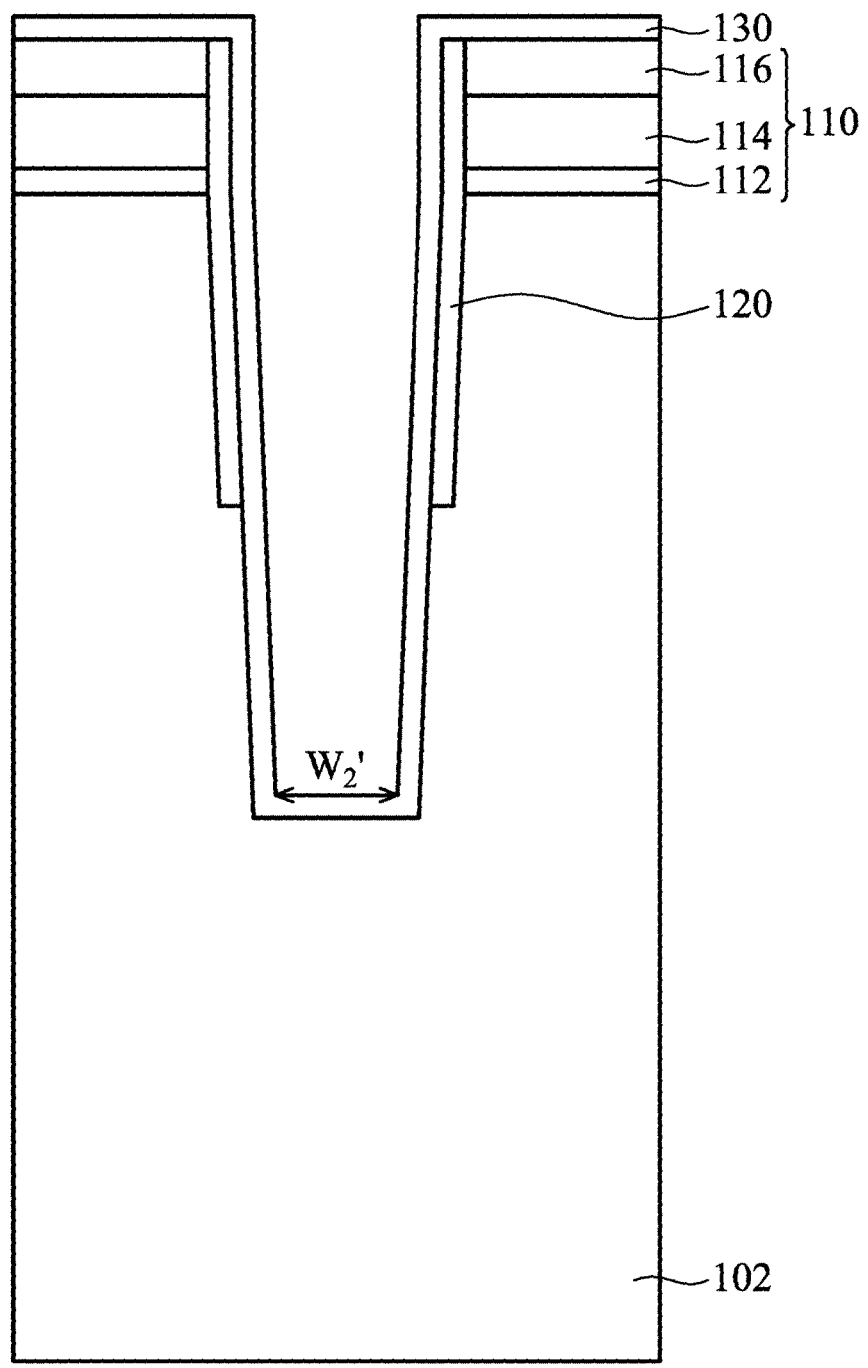

Next, as shown in FIG. 1D, a second protective layer 130 is formed on the sidewalls and a bottom surface 128b of the second recess 128, in accordance with some embodiments of the disclosure. In addition, the second protective layer 130 is formed on the top surface of the hard mask layer 110, and on the first protective layer 120. The second protective layer 130 is configured to protect the underlying substrate 102 from being etched in a subsequent process.

In some embodiments, the second protective layer 130 is made of oxide or nitride. In some embodiments, the second protective layer 130 is made of silicon oxide (SiOx). In some other embodiments, the second protective layer 130 is made of silicon nitride (SixNy). The first protective layer 120 and the second protective layer 130 both are made of the same materials, and they may be removed in a later step to reduce the time and cost required for fabrication.

In some embodiments, the second protective layer 130 is formed by a deposition process, such as a chemical vapor deposition (CVD) process, an atomic layer deposition (ALD) process, or another applicable process. In some embodiments, the second protective layer 130 has a thickness in a range from about 5 nm to about 20 nm. Because the second recess 128 is partially filled with the second protective layer 130, and therefore the second width $W_1$ of the second bottom surface 128b of the second recess 128 is reduced. After the second protective layer 130 is formed, the bottom surface 128b of the second recess 128 has a narrowed second width $W_2'$ smaller than the second width $W_1$.

Figure 1E:
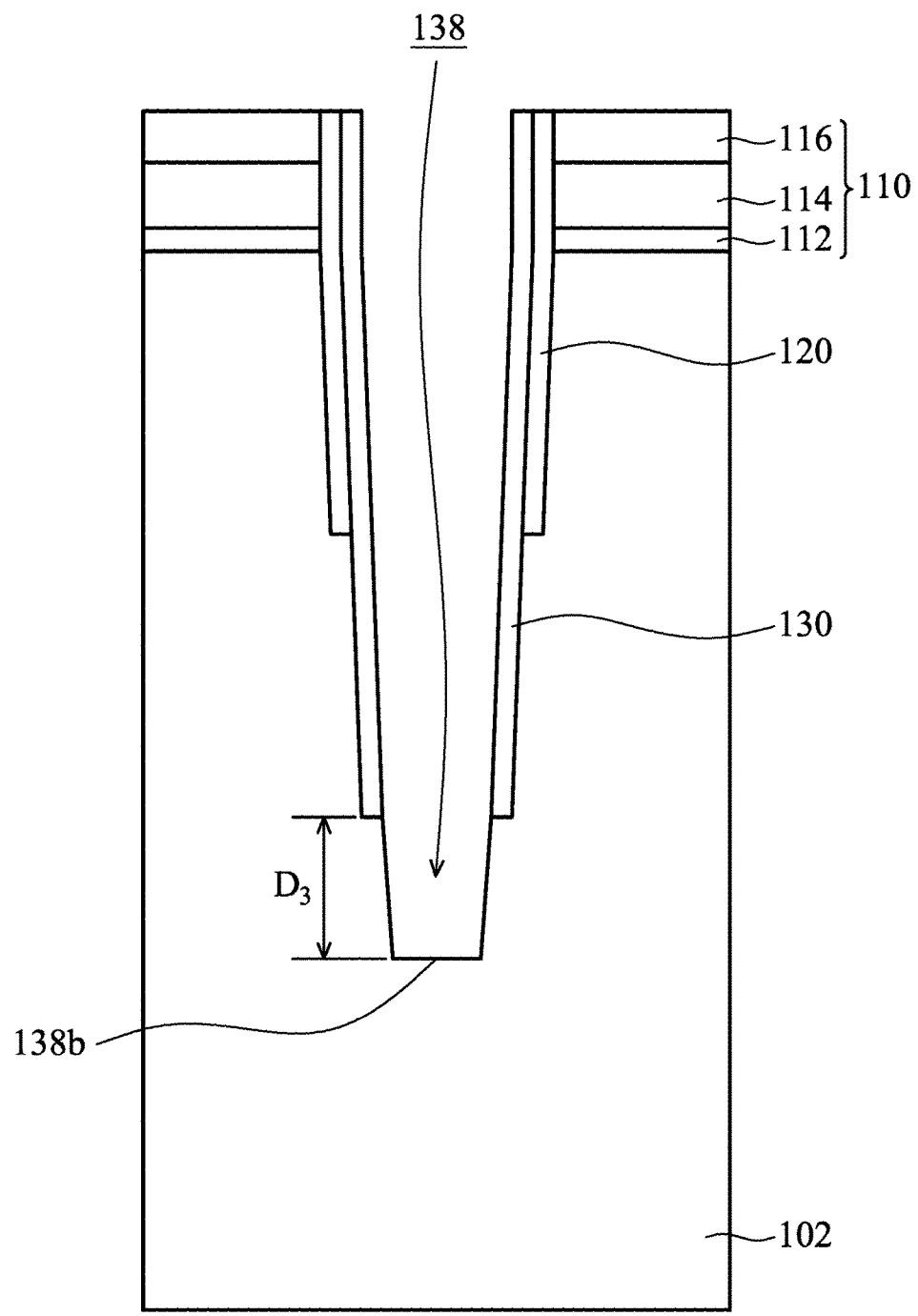

Afterwards, as shown in FIG. 1E, a portion of the substrate 102 below the second recess 128 is removed by using the hard mask layer 110 and the second protective layer 130 as a mask, in accordance with some embodiments of the disclosure. In addition, the top portion of the second protective layer 130 which is on the hard mask layer 110 is removed. As a result, a third recess 138 below the second recess 128 is obtained.

The sidewalls of the hard mask layer 110, and the sidewalls of the substrate 102 which are protected or covered by the first protective layer 120 and the second protective layer 130 are not removed. The third recess 138 has a third bottom surface 138b with a third bottom surface 138b with a third width $W_3$ and a third depth $D_3$. The third width $W_3$ is smaller than the second width $W_2$.

Figure 1F:
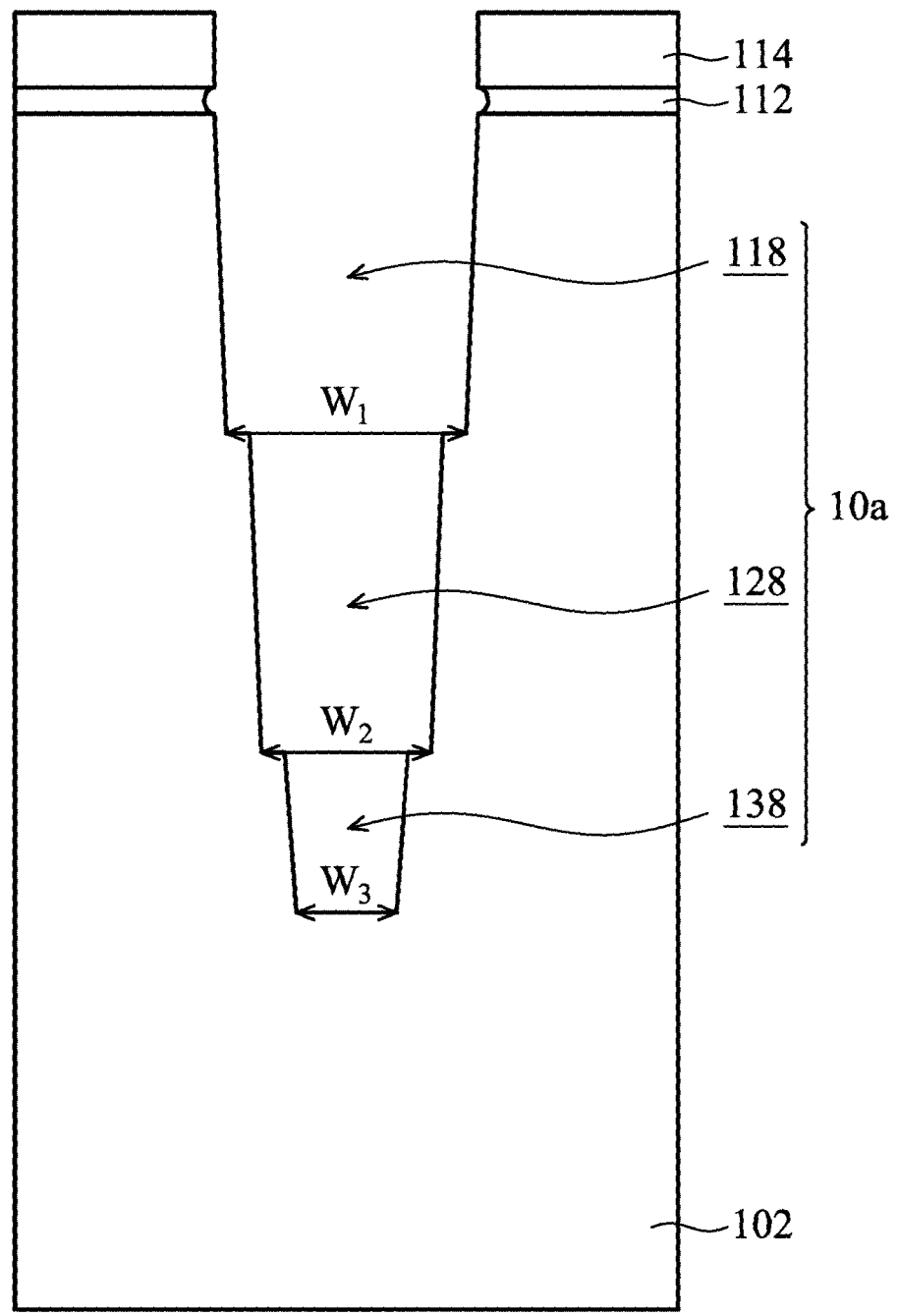
Figure 1F:
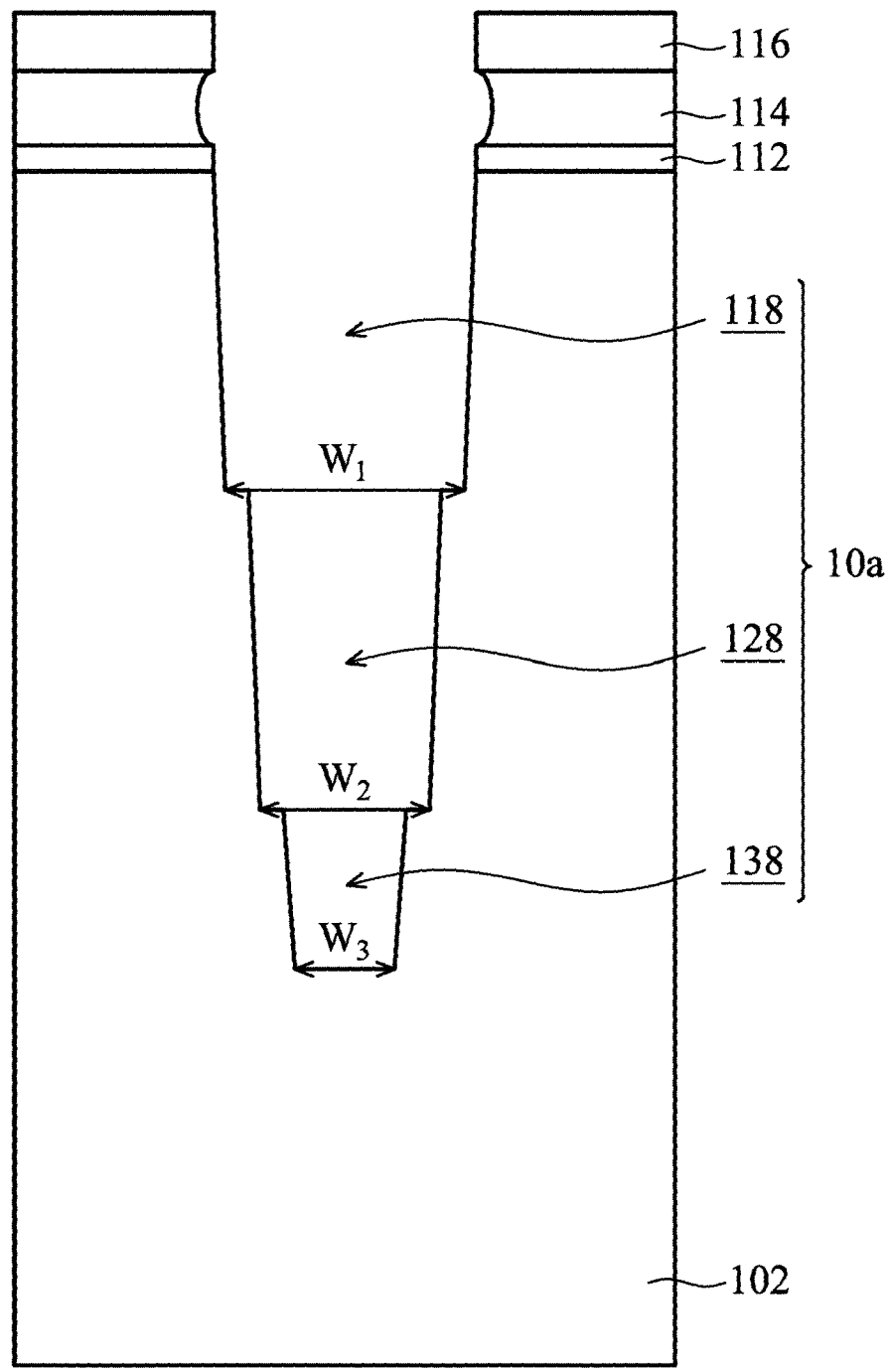

Next, as shown in FIG. 1F, the first protective layer 120 and the second protective layer 130 are removed, in accordance with some embodiments of the disclosure. As a result, a deep trench structure 10a is constructed by the first recess 118, the second recess 128 and the third recess 138. The first recess 118 is connected to the second recess 128, and the second recess 128 is connected to the third recess 138.

It should be noted that the deep trench structure 10a has a tapered profile from top to bottom or it has a stair shape. The first width $W_1$ of the bottom surface 118b of the first recess 118 is wider than the second width $W_2$ of the bottom surface 128b of the second recess 128. The second width $W_2$ of the bottom surface 128b of the second recess 128 is wider than the third width $W_3$ of the third bottom surface 138b of the third recess 138. As mentioned above, the first width $W_1$ between the bottom surface of the first recess 118 and the top surface of and the second recess 128 is wider than the second width $W_2$ between the bottom surface of second recess 128 and the top surface of the third recess 138. Note that the bottom surface 118b of the first recess in FIG. 1A and the bottom surface 128b of the second recess 128 in FIG. 1C do not exist in FIG. 1F since the first recess 118, the second recess 128 are connected to the third recess 138.

In some embodiments, as shown in FIG. 1F, the first protection layer 120 is made of oxide. When the step of removing the first protection layer 120 and the second protection layer 130 is performed, a portion of the first oxide mask layer 112 is simultaneously removed, but the nitride mask layer 114 is not etched. In addition, the second oxide mask layer 116 is completely removed. After the etching process for removing the first protection layer 120 and the second protection layer 130, a sidewall of the first oxide mask layer 112 is not aligned with a sidewall of the nitride mask layer 114.

In some embodiments, the first protective layer 120 and the second protective layer 130 are removed by an etching solution including hydrofluoric acid (HF). The substrate 102 may have some defects after the etching process since the substrate 102 is damaged by the etching process. The defects may be embedded in the first protective layer 120 and/or the second protection layer 130, and the defects are removed along with removal of the first protection layer 120 and the second protection layer 130.

Figure 1G:
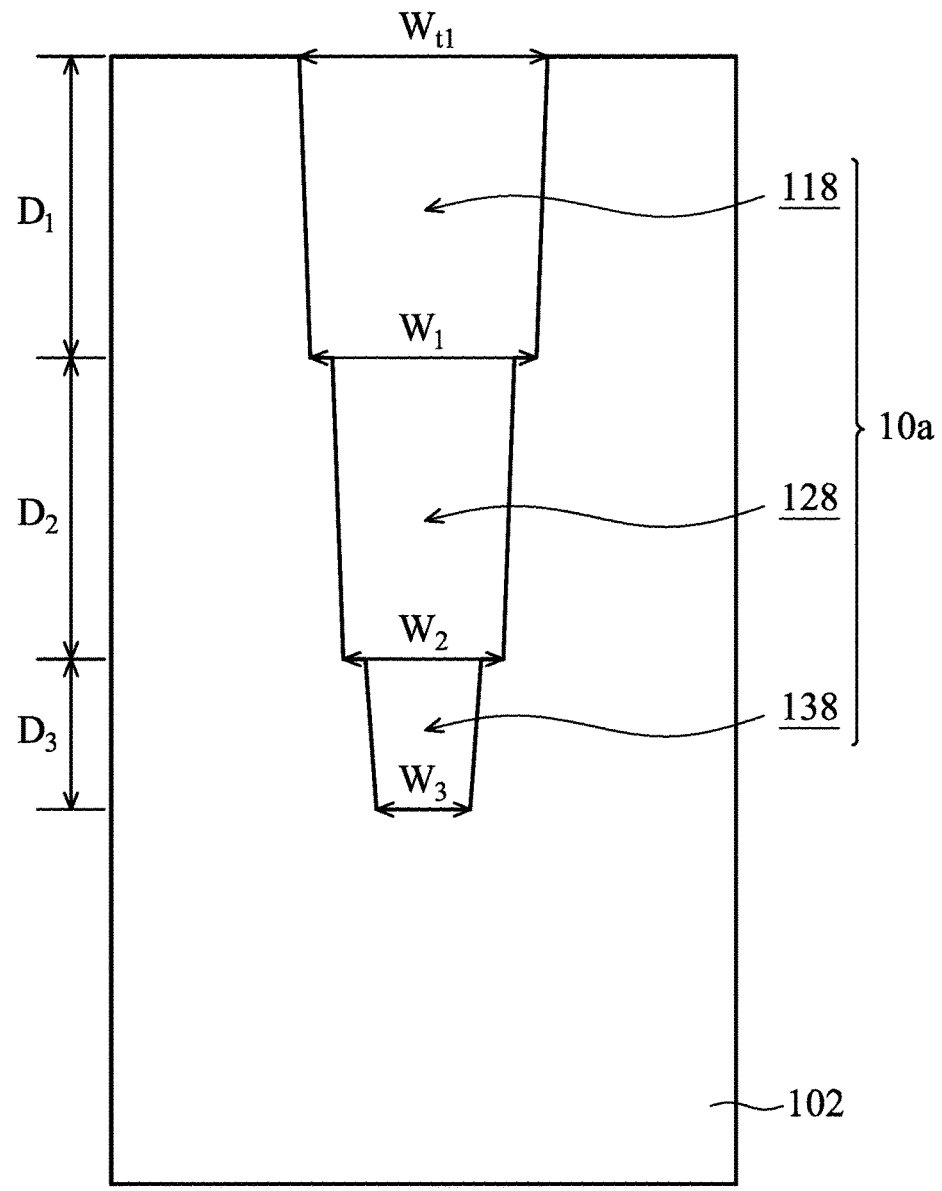

Afterwards, as shown in FIG. 1G, the nitride mask layer 114 and the remaining first oxide layer 112 are removed to form the deep isolation structure 10a. In some embodiments, the nitride mask layer 114 is removed by an etching solution including phosphoric acid. As a result, the deep isolation structure 10a has a tapered profile from top to bottom or has a stair shape. The deep isolation structure 10a has a top opening width $W_{t1}$. The top opening width $W_{t1}$ is greater than the first width $W_1$. In some embodiments, the top opening width $W_{t1}$ is in a range from about 100 nm to 300 nm.

FIG. 1F' shows a cross-sectional representation of the deep trench structure after the first protection layer and the second protection layer are removed in another embodiment. When the first protection layer 120 and the second protective layer 130 are made of nitride, and when the step of removing the first protection layer 120 and the second protection layer 130 is performed, a portion of the nitride mask 114 layer are simultaneously removed. Therefore, the nitride mask 114 layer has curved sidewalls.

A deep trench structure with high aspect ratio is not easy to form in a single step. Therefore, the disclosure uses multiple steps to form a number of recesses to obtain a deep trench structure. The sidewall of the first recess 118 is temporarily protected by the first protective layer 120 when an etching process is performed to remove a portion of the substrate 102 below the first recess 118. Therefore, the undesirable bowing sidewalls of the first recess will not be formed due to the protection of the first protective layer 120.

In addition, the deep trench structure with high aspect ratio is not easily filled with filling material without leaving any voids. In this disclosure, the width of the deep trench structure 10a is gradually increased from bottom to top, and therefore it is easy to fill the filling material into the deep trench structure 10a without leaving any voids.

In some embodiments, the deep trench structure 10a has an aspect ratio that is in a range from about 100 to about 200. In some embodiments, the deep trench structure 10a has a depth which is the sum of the first depth $D_1$, the second depth $D_2$ and the third depth $D_3$. In some embodiments, the depth of the deep trench structure 10a is in a range from about 5 μm to about 20 μm. In some embodiments, the ratio of the first depth $D_1$, the second depth $D_2$ and the third depth $D_3$ is about (2-4):(2-4):1.

The stair-shaped deep trench has a wider top opening width to help in the filling of materials. Furthermore, the sidewalls of the first recess 118 and the second recess 128 are temporarily protected by the first protective layer 120 and/or the second protective layer 130, and therefore the unwanted bowing or curved sidewall will not be formed. When a deep trench structure with a bowing sidewall is filled with filling materials, the risk of leaving voids or seams in the deep trench structure is increased.

FIGS. 2A-2G show cross-sectional representations of various stages of forming a deep trench structure 10b, in accordance with some embodiments of the disclosure. Some processes and materials used to form the deep trench structure 10b are similar to, or the same as, those used to form the deep trench structure 10a and are not repeated herein. The difference between the second embodiment in FIGS. 2A-2G and the first embodiment in FIGS. 1A-1G is that the first protective layer 120 and the second protective layer 130 are formed by an oxidation process, rather than a deposition process. Therefore, the positions of the first protective layer 120 and the second protective layer 130 in FIGS. 2A-2G are different from those of first protective layer 120 and the third protective layer 130 in FIGS. 1A-1G.

Figure 2A:
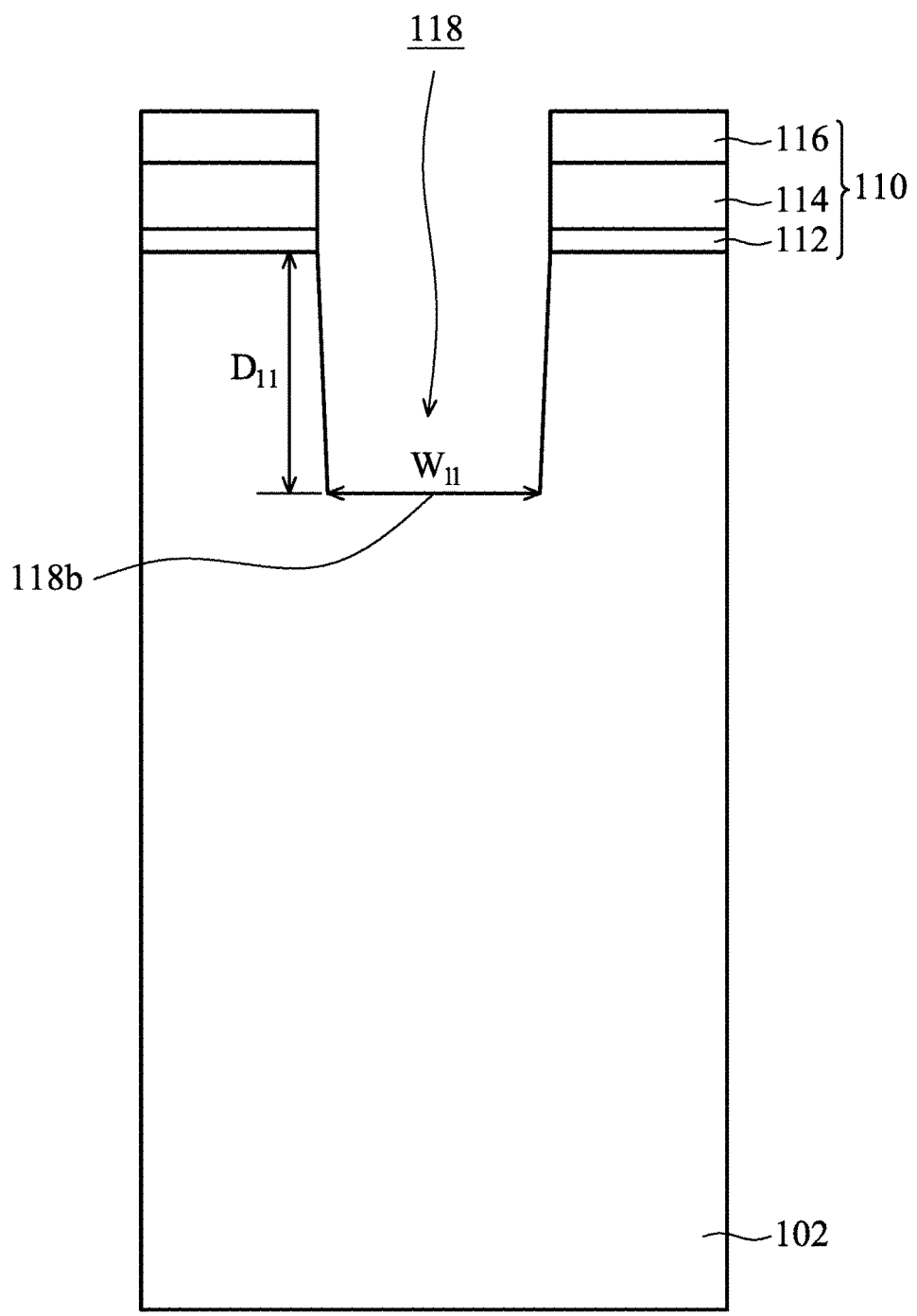
FIGS. 2A-2G show cross-sectional representations of various stages of forming a deep trench structure, in accordance with some embodiments of the disclosure.

As shown in FIG. 2A, the hard mask layer 110 is formed on the substrate 102. The hard mask layer 110 includes multiple layers. In some embodiments, the hard mask layer 110 includes the first oxide mask layer 112, the nitride mask layer 114 and the second oxide mask layer 116.

Next, a portion of the substrate 102 is removed by using the patterned hard mask layer 110 as a mask to form a first recess 118. The first recess 118 has a first bottom surface 118b with a first width $W_{11}$ and a first depth $D_{11}$. The first depth $D_{11}$ is measured from a top surface of the substrate 102 to the bottom surface 118b of the first recess 118. The first recess 118 has opposite sidewalls, and the sidewalls are sloped to the bottom surface 118b.

Figure 2B:
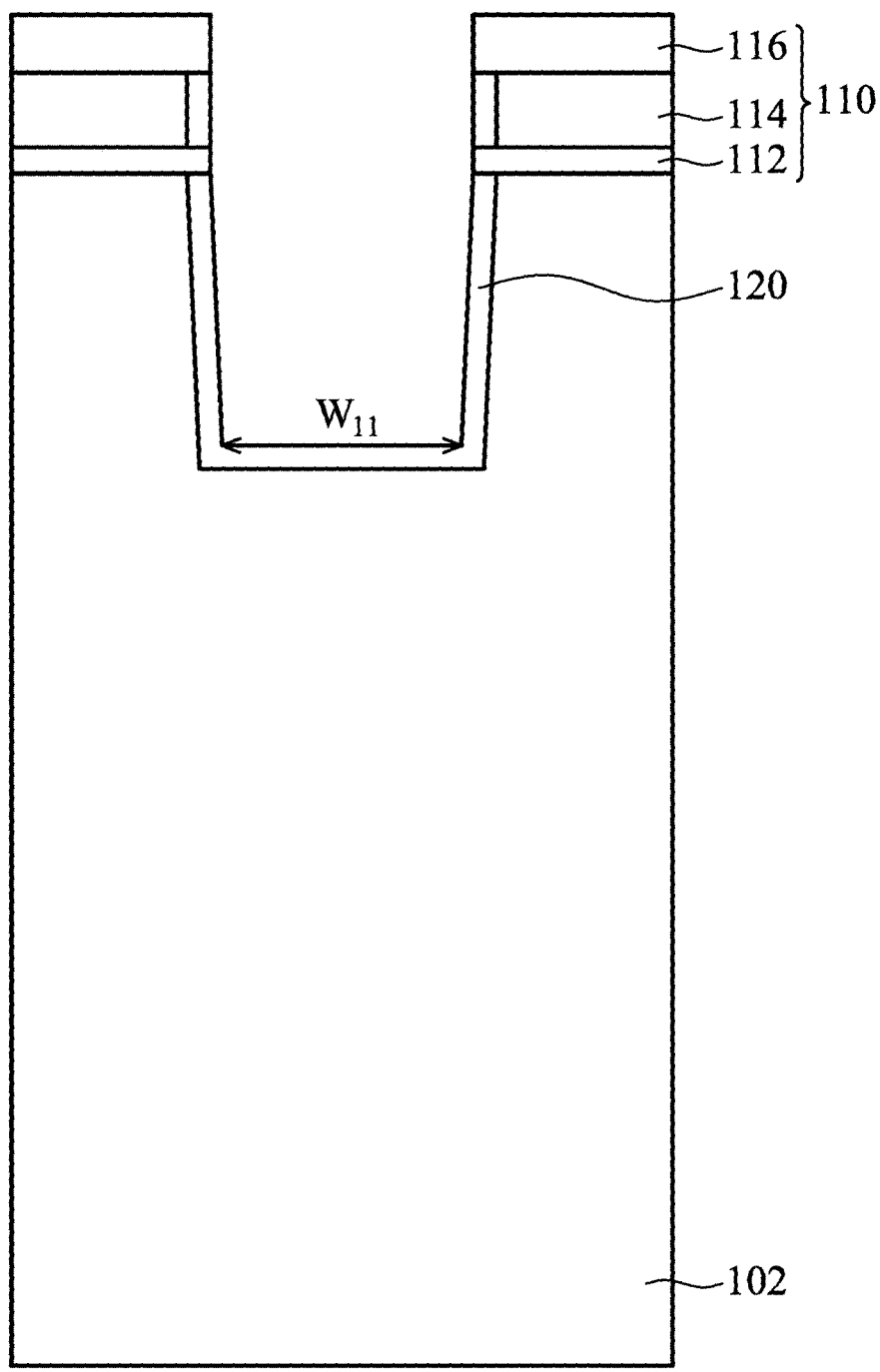

Afterwards, as shown in FIG. 2B, the first protective layer 120 is formed on sidewalls and a bottom surface of the first recess 118, in accordance with some embodiments of the disclosure. The first protective layer 120 is configured to protect the underlying substrate 102 from being etched in a subsequent process.

In some embodiments, the first protective layer 120 is formed by an oxidation process, such as a thermal oxidation process, an in-situ steam generation (ISSG) process, or another applicable process. In some embodiments, the first protective layer 120 is formed by a thermal oxidation process, and therefore a portion of the substrate 102 made of silicon is consumed to form silicon oxide (SiOx). The first protective layer 120 is formed to line the sidewalls and bottom surface of the first recess 118. In addition, a portion of the sidewalls of the nitride mask layer 114 is also oxidized, and therefore the first protective layer 120 is also formed on sidewalls of the nitride mask layer 114. Since the second oxide mask layer 116 is an oxide layer, it will not be oxidized. Accordingly, the first protective layer 120 is not formed on a top surface of the second oxide mask layer 116.

After the oxidation process, the first recess 118 has a first bottom surface 118b with the same first width $W_1$ since the first protective layer 120 is formed in the substrate 102, not on the substrate 102.

Figure 2C:
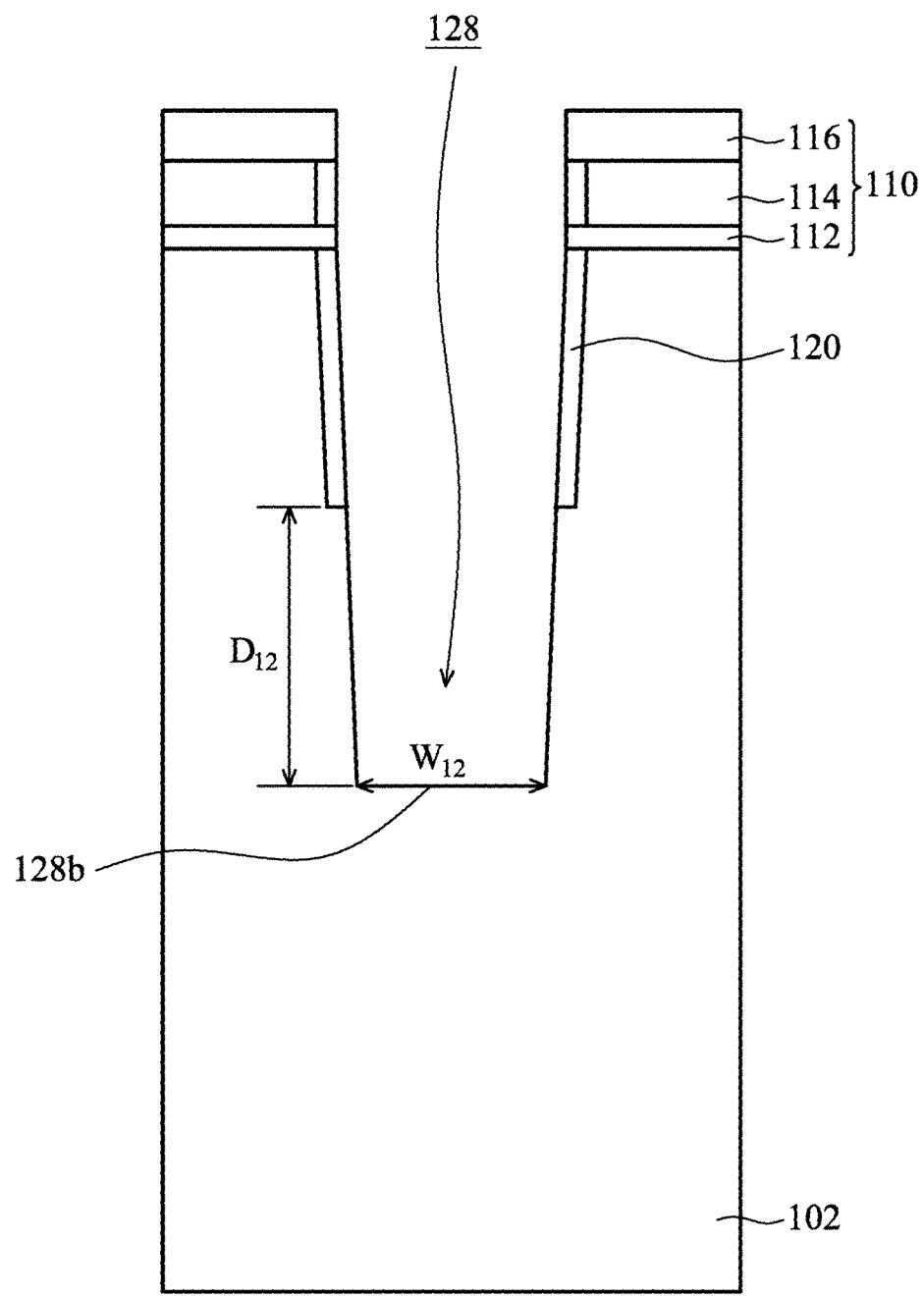

Afterwards, as shown in FIG. 2C, a portion of the substrate 102 below the first recess 118 is removed by using the hard mask layer 110 and the first protective layer 120 as a mask, in accordance with some embodiments of the disclosure. As a result, a second recess 128 below the first recess 118 is obtained.

It should be noted that the sidewalls of the hard mask layer 110, and the sidewalls of the substrate 102 which are protected or covered by the first protective layer 120 are not removed. The second recess 128 has a second bottom surface 128b with a second width $W_{12}$ and a second depth $D_{12}$. The second width $W_{12}$ is smaller than the first width $W_{11}$.

In some embodiments, the portion of the substrate 102 below the first recess 118 is removed by an etching process, such as a dry etching process. The etching process provides a high selectivity toward the substrate 102 and the first protective layer 120. More specifically, the etching rate of the substrate 102 in the etching process is higher than the etching rate of the first protective layer 120.

Figure 2D:
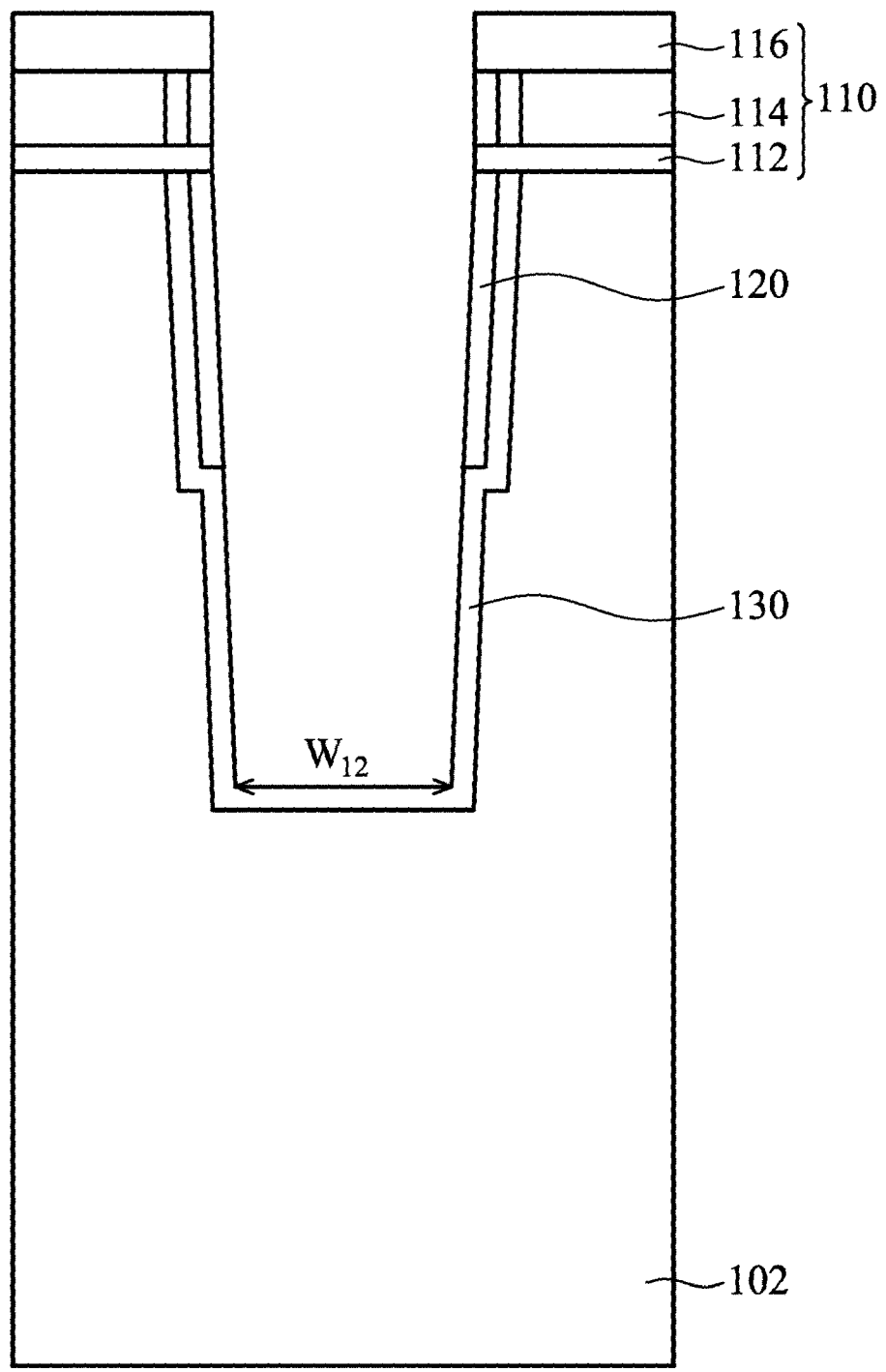

Next, as shown in FIG. 2D, the second protective layer 130 is formed on the sidewalls and bottom surface 128b of the second recess 128, in accordance with some embodiments of the disclosure.

Note that the second protective layer 130 is formed by an oxidation process, and a portion of the substrate 102 is consumed to form the second protective layer 130. As a result, compared with the first protective layer 120, the second protective layer 130 is far away from the first recess 118. More specifically, the second protective layer 130 is formed in a deeper location in the substrate 102 than the first protective layer 120. Therefore, an extended second protective layer 130 is formed and is extended away from the first recess 118 in a horizontal direction.

Figure 2E:
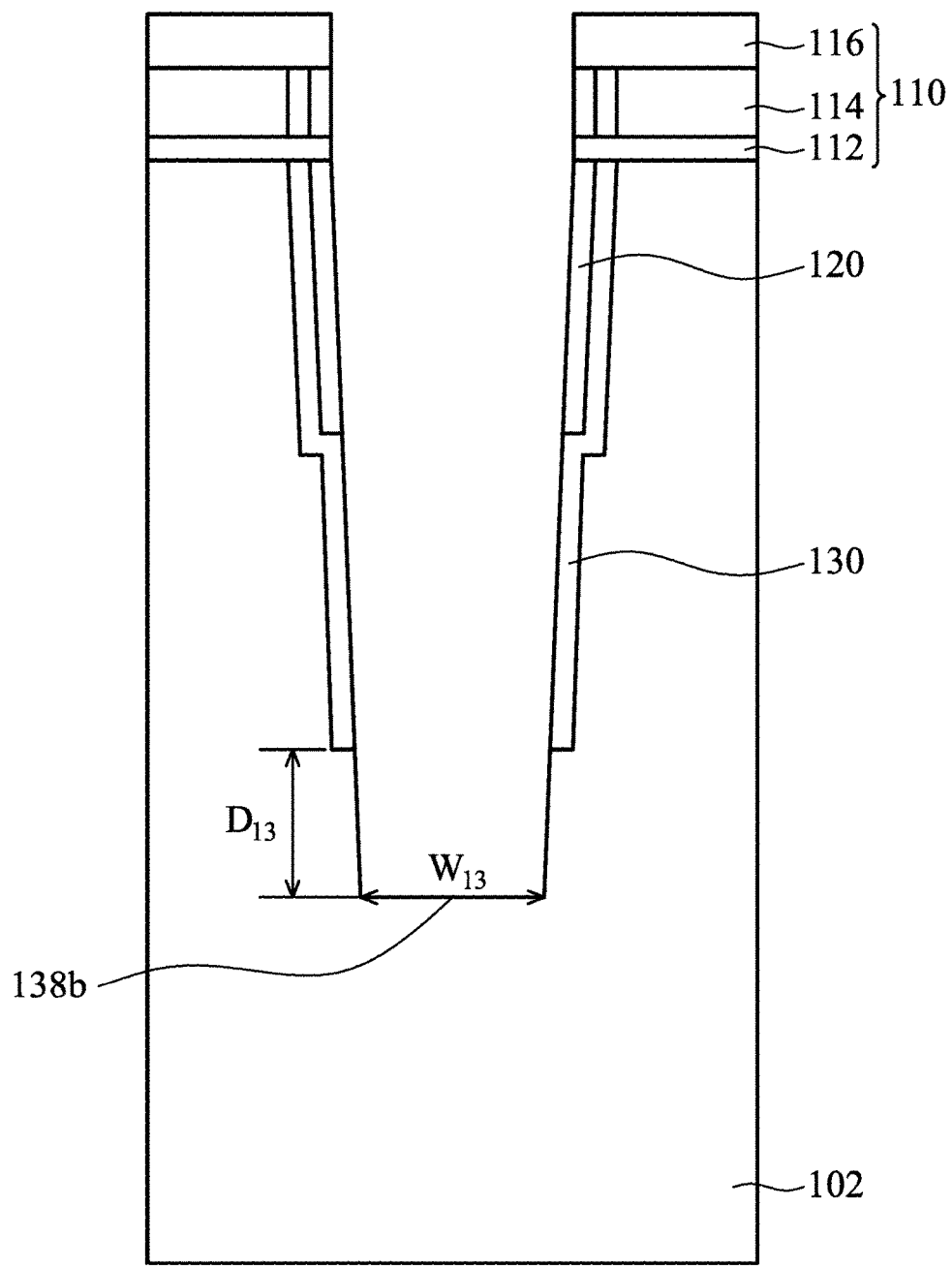

Next, as shown in FIG. 2E, a portion of the substrate 102 below the second recess 128 is removed by using the hard mask layer 110 and the second protective layer 130 as a mask, in accordance with some embodiments of the disclosure. As a result, a third recess 138 below the second recess 128 is obtained.

The sidewalls of the hard mask layer 110, and the sidewalls of the substrate 102 which are protected or covered by the first protective layer 120 and the second protective layer 130 are not removed. The third recess 138 has a third bottom surface 138b with the third bottom surface 138b with a third width $W_{13}$ and a third depth $D_{13}$. The third width $W_{13}$ is smaller than the second width $W_{12}$.

Figure 2F:
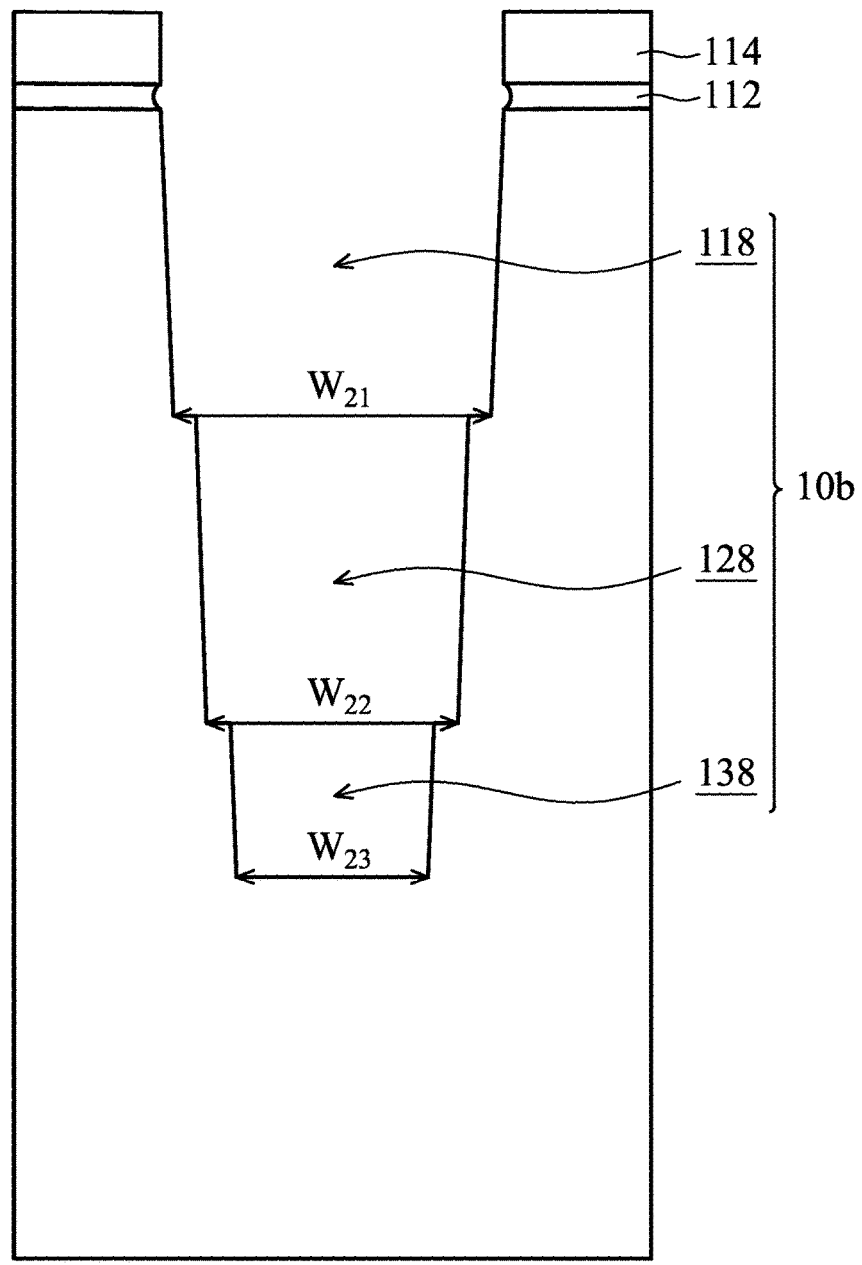

Afterwards, as shown in FIG. 2F, the first protective layer 120 and the second protective layer 130 are removed, in accordance with some embodiments of the disclosure. As a result, a deep trench structure 10b is constructed by the first recess 118, the second recess 128 and the third recess 138. The first recess 118 is connected to the second recess 128, and the second recess 128 is connected to the third recess 138.

Since the first protective layer 120 and the second protective layer 130 are made of oxide, a portion of the first oxide mask layer 112 is simultaneously removed, but the nitride mask layer 114 is not etched. In addition, the second oxide mask layer 116 is completely removed.

It should be noted that the deep trench structure 10b has a stair shape. Note that after the first protective layer 120 and the second protective layer 130 are removed, the first width $W_{11}$ of the first recess 118 is enlarged to have an enlarged first width $W_{21}$, and the second width $W_{12}$ of the second recess 128 is enlarged to have an enlarged second width $W_{22}$. The enlarged first width $W_{21}$ is greater than the first width $W_{11}$, and the enlarged second width $W_{22}$ is greater than the second width $W_{12}$. The enlarged width has the advantage of reducing the difficulty of filling the deep trench.

Furthermore, after the first protective layer 120 and the second protective layer 130 are removed, the first depth $D_{11}$ of the first recess 118 is elongated to have an elongated first depth $D_{11}'$, the second depth $D_{12}$ of the second recess 128 is elongated to have an elongated second depth $D_{12}'$. The third depth $D_{13}$ of the third recess 138 is elongated to have an elongated third depth $D_{13}'$. In some embodiments, the ratio of the first depth $D_{11'}$, the second depth $D_{12'}$ and the third depth $D_{13'}$ is about (2-4):(2-4):1.

Figure 2G:
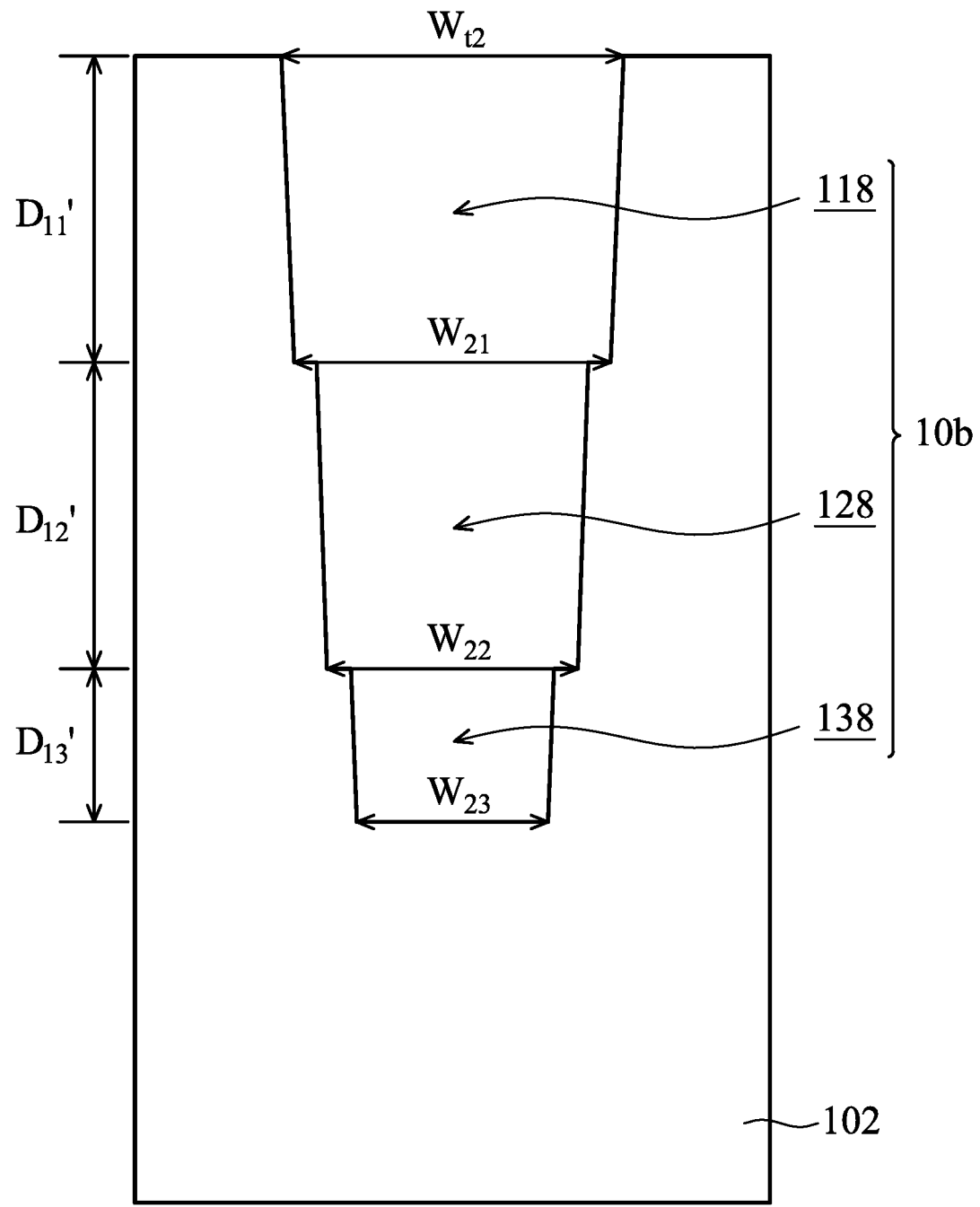

Next, as shown in FIG. 2G, the nitride mask layer 114 and the remaining first oxide layer 112 are removed to form the deep isolation structure 10b. In some embodiments, the nitride mask layer 114 is removed by an etching solution including phosphoric acid. Compared with the deep trench structure 10a in FIG. 1G, the deep trench structure 10b in FIG. 2G has a greater top opening width $W_{t2}$ than the top opening width $W_{t1}$ of the deep isolation structure 10a.

Figure 3A:
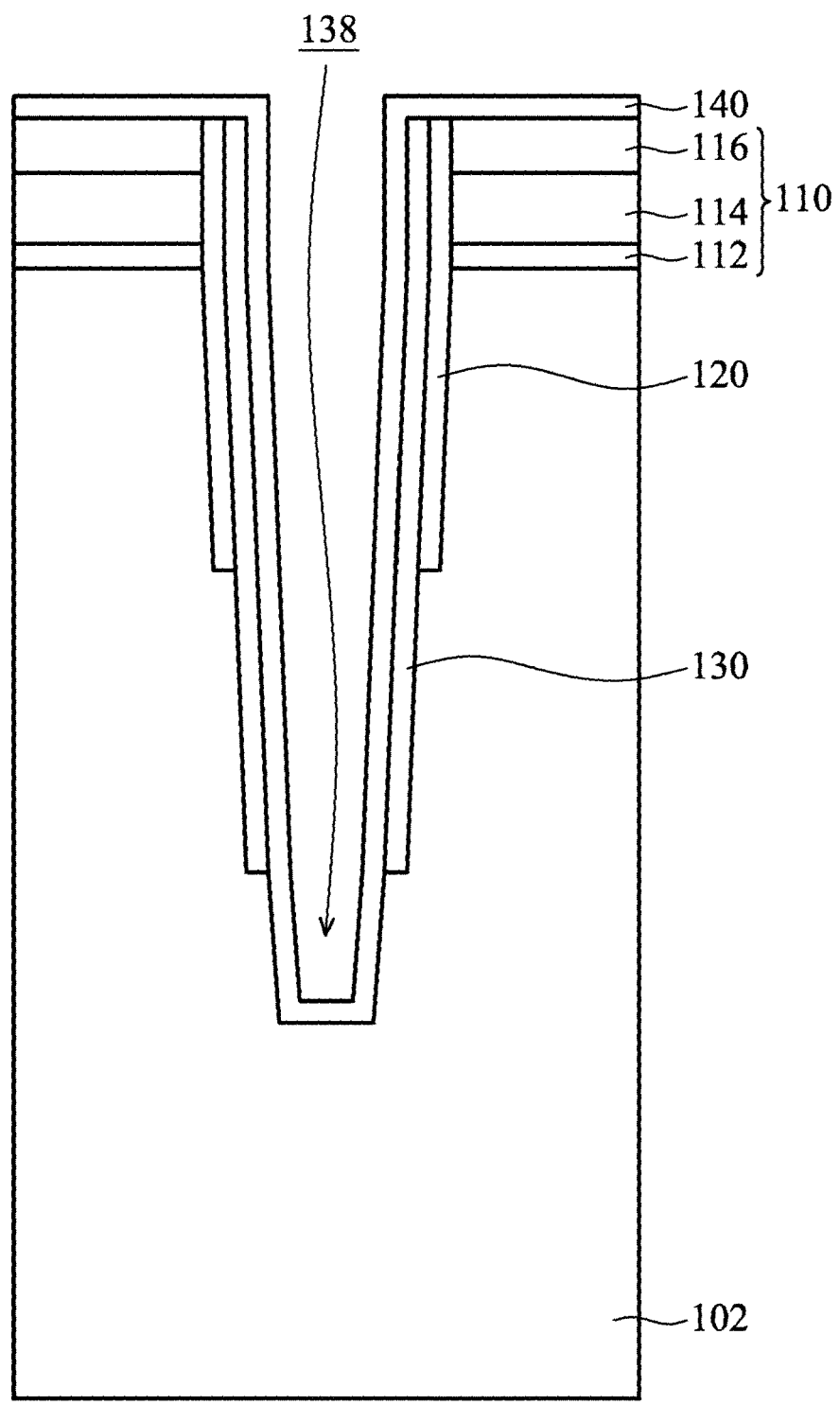
FIGS. 3A-3C show cross-sectional representations of various stages of forming a deep trench structure, in accordance with some embodiments of the disclosure.
Figure 3B:
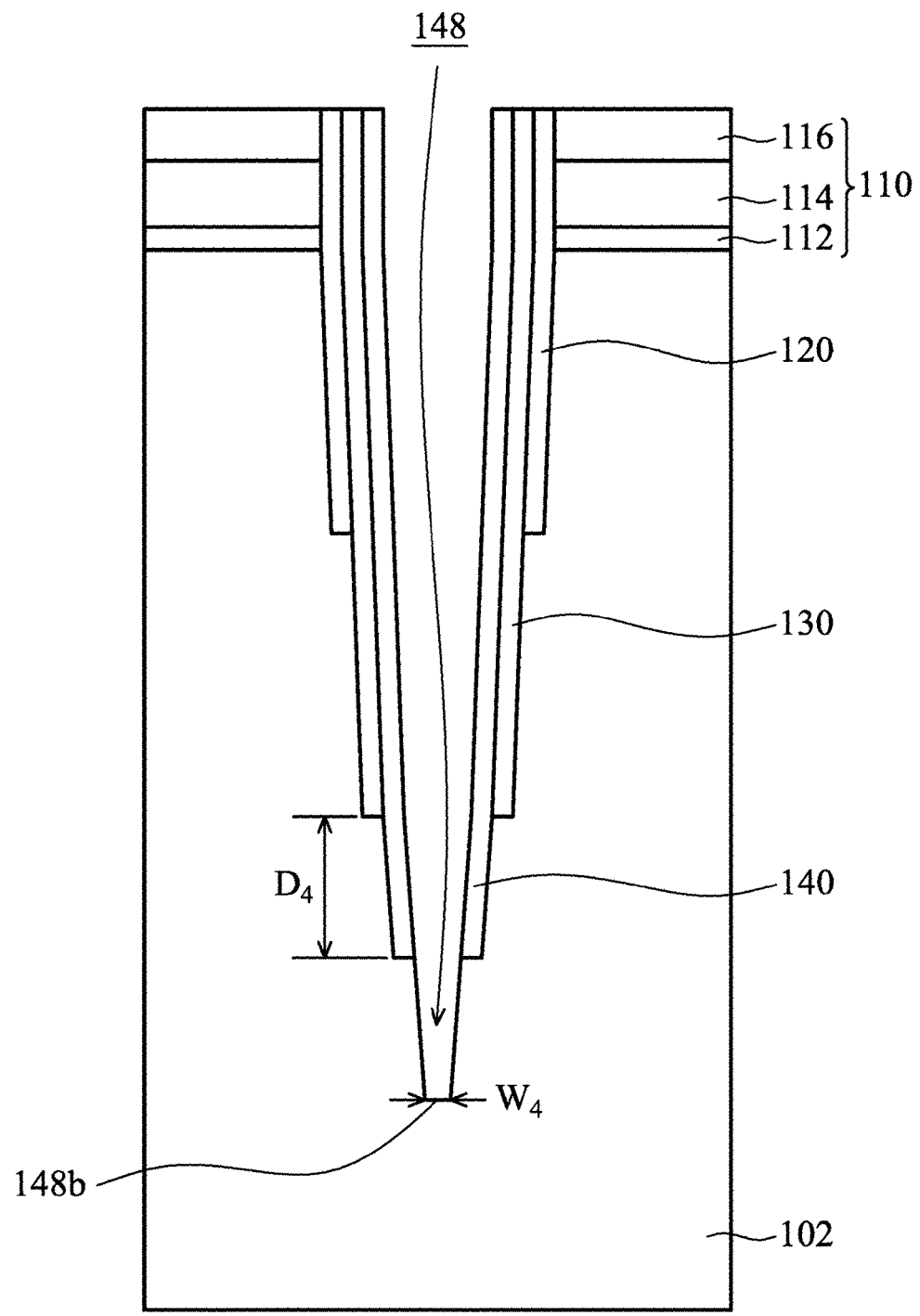
Figure 3C:
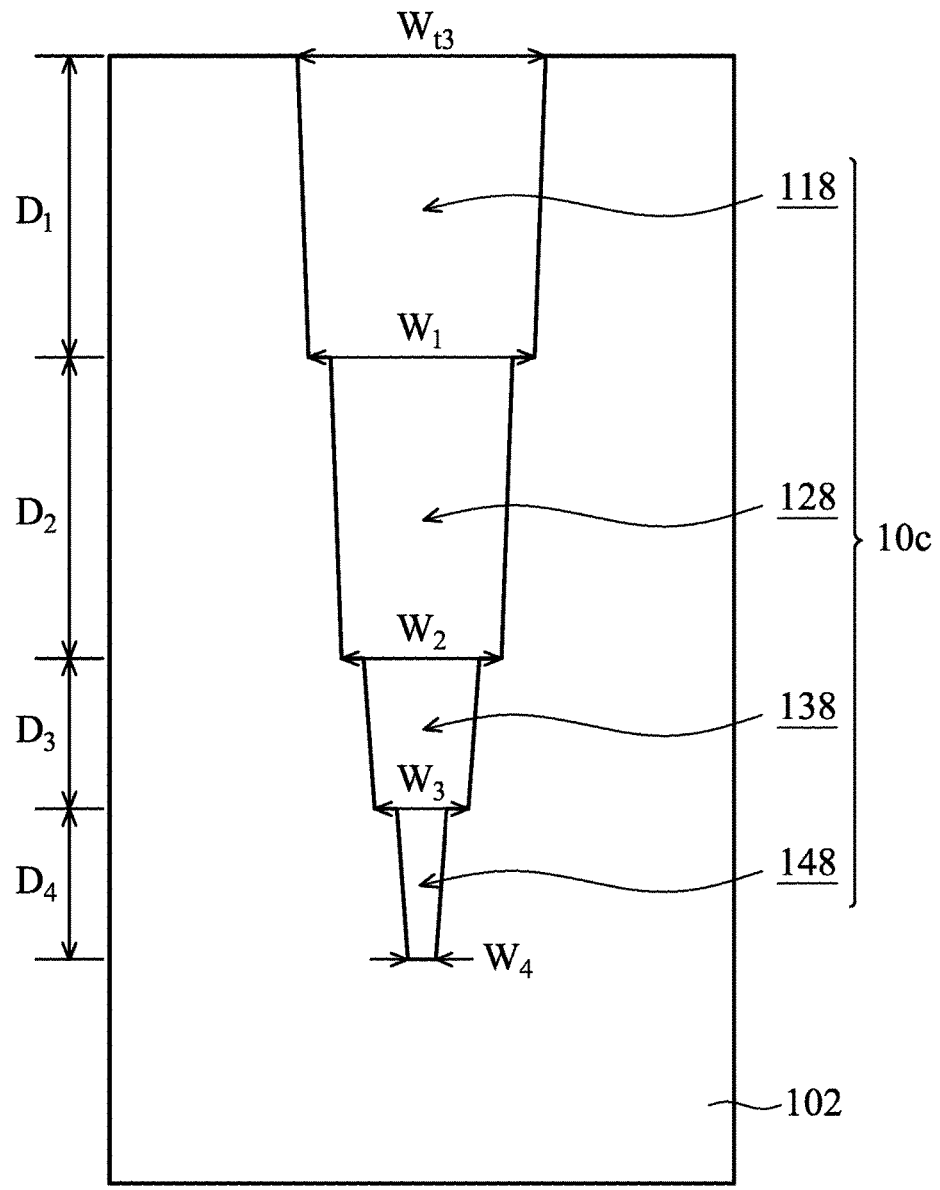

FIGS. 3A-3C show cross-sectional representations of various stages of forming a deep trench structure 10c, in accordance with some embodiments of the disclosure.

FIG. 3A shows other embodiments after the step of FIG. 1E. A third protective layer 140 is formed on the second protective layer 130 and the mask layer 110. In some embodiments, the third protective layer 140 is formed by a deposition process, such as a chemical vapor deposition (CVD) process, an atomic layer deposition (ALD) process, or another applicable process.

Next, as shown in FIG. 3B, a portion of the substrate 102 below the third recess 138 is removed by using the hard mask layer 110 and the third protective layer 140 as a mask, in accordance with some embodiments of the disclosure. In addition, the top portion of the third protective layer 140 which is on the hard mask layer 110 is removed. As a result, a fourth recess 148 below the third recess 138 is obtained.

The fourth recess 148 has a fourth bottom surface 148b with a fourth width $W_4$ and a fourth depth $D_4$. The fourth depth $D_4$ is measured from a top surface of the substrate 102 to the bottom surface 148b of the fourth recess 148. The fourth recess 148 has opposite sidewalls, and the sidewalls are sloped to the bottom surface 148b.

Afterwards, as shown in FIG. 3C, the hard mask layer 110, the first protective layer 120, the second protective layer 130 and the third protective layer 140 are removed to form a deep trench structure 10c, in accordance with some embodiments of the disclosure. The deep trench structure 10c has a stair shape and has a top opening width $W_{t3}$. In some embodiments, the top opening width $W_{t3}$ is substantially equal to the top opening width $W_{t1}$. In some embodiments, the ratio of the first depth $D_1$, the second depth $D_2$, the third depth $D_3$ and the fourth depth $D_4$ is about (2-4):(2-4):1:1.

Figure 4A:
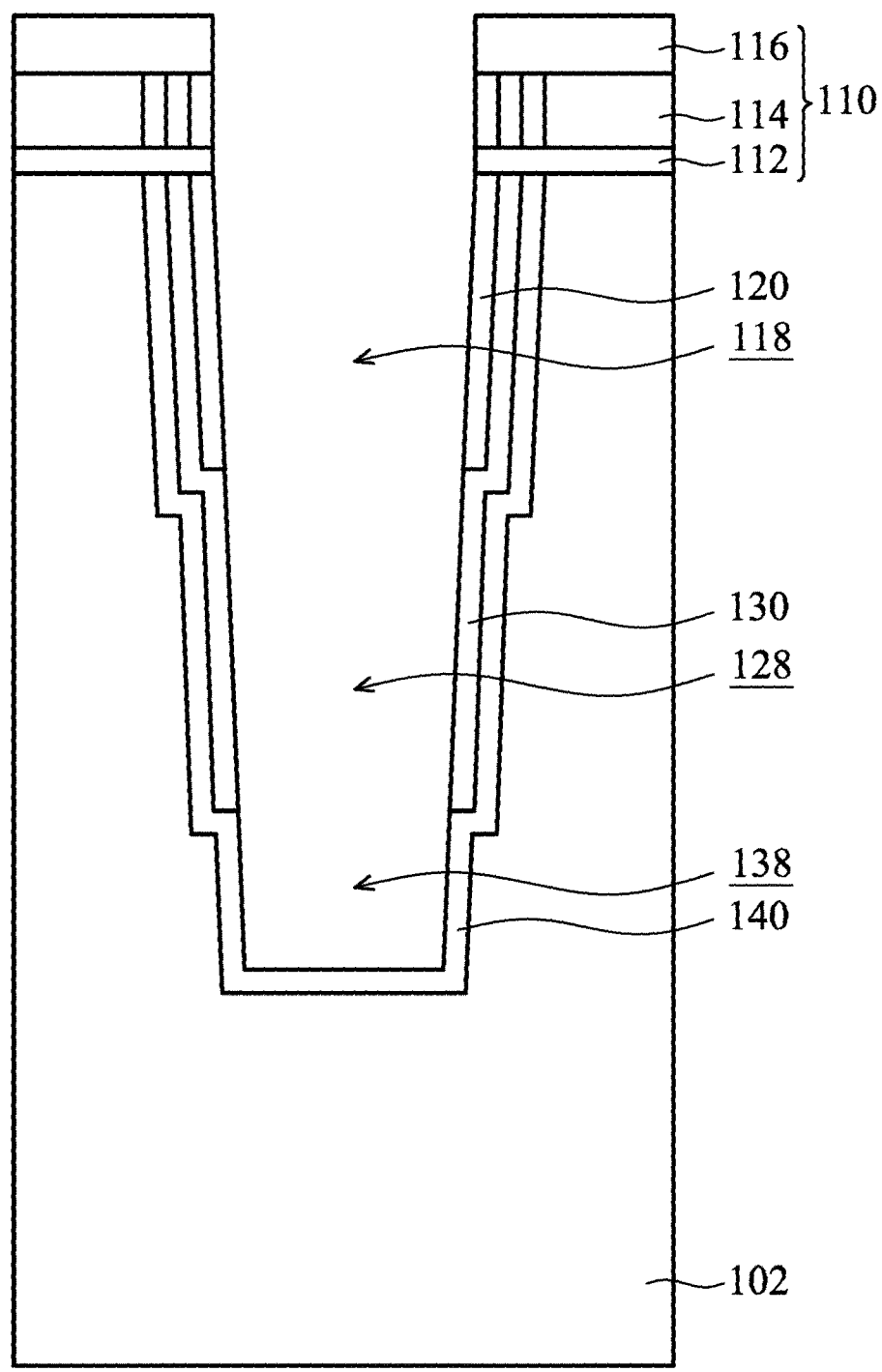
FIGS. 4A-4C show cross-sectional representations of various stages of forming a deep trench structure, in accordance with some embodiments of the disclosure.
Figure 4B:
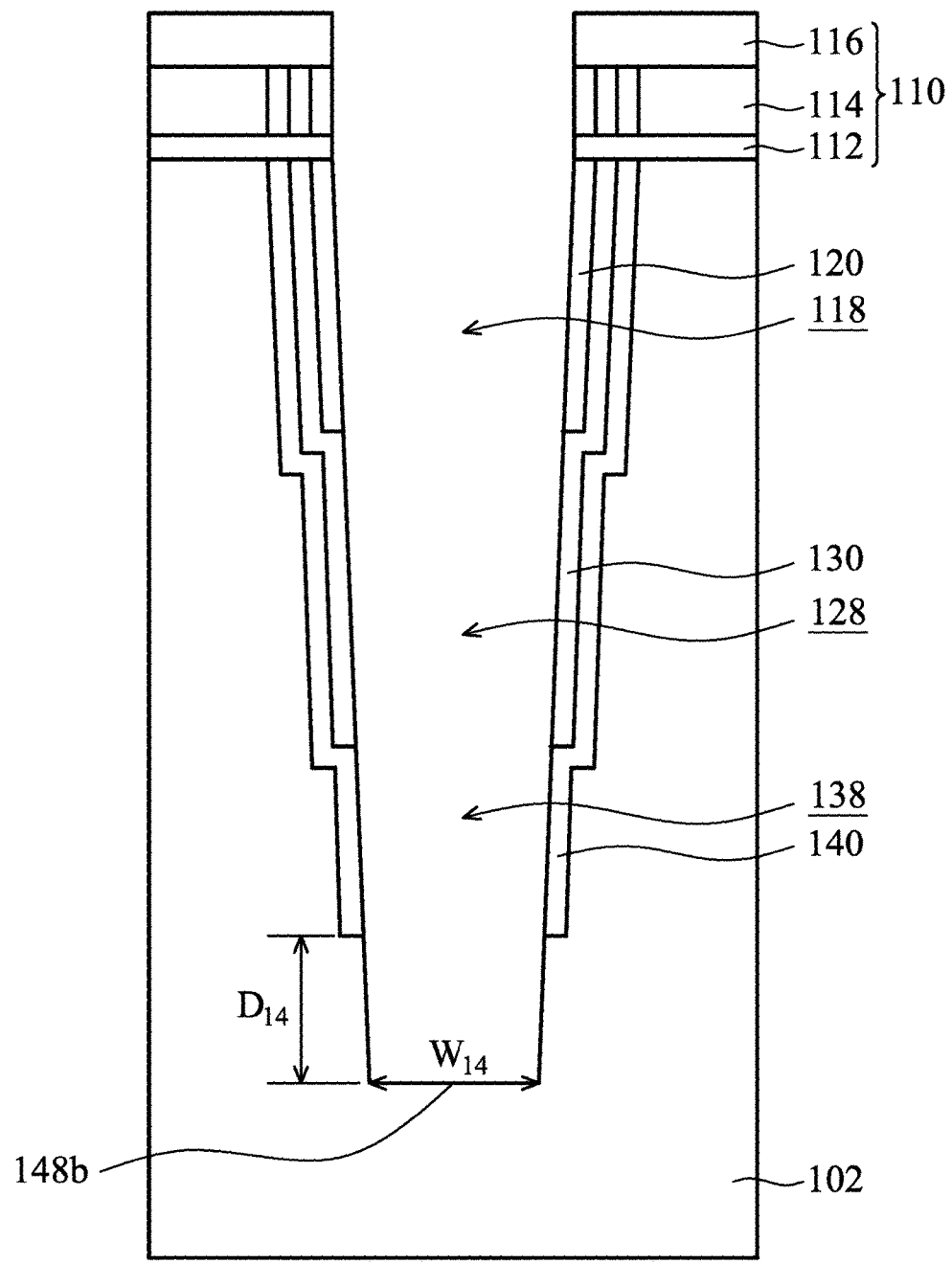
Figure 4C:
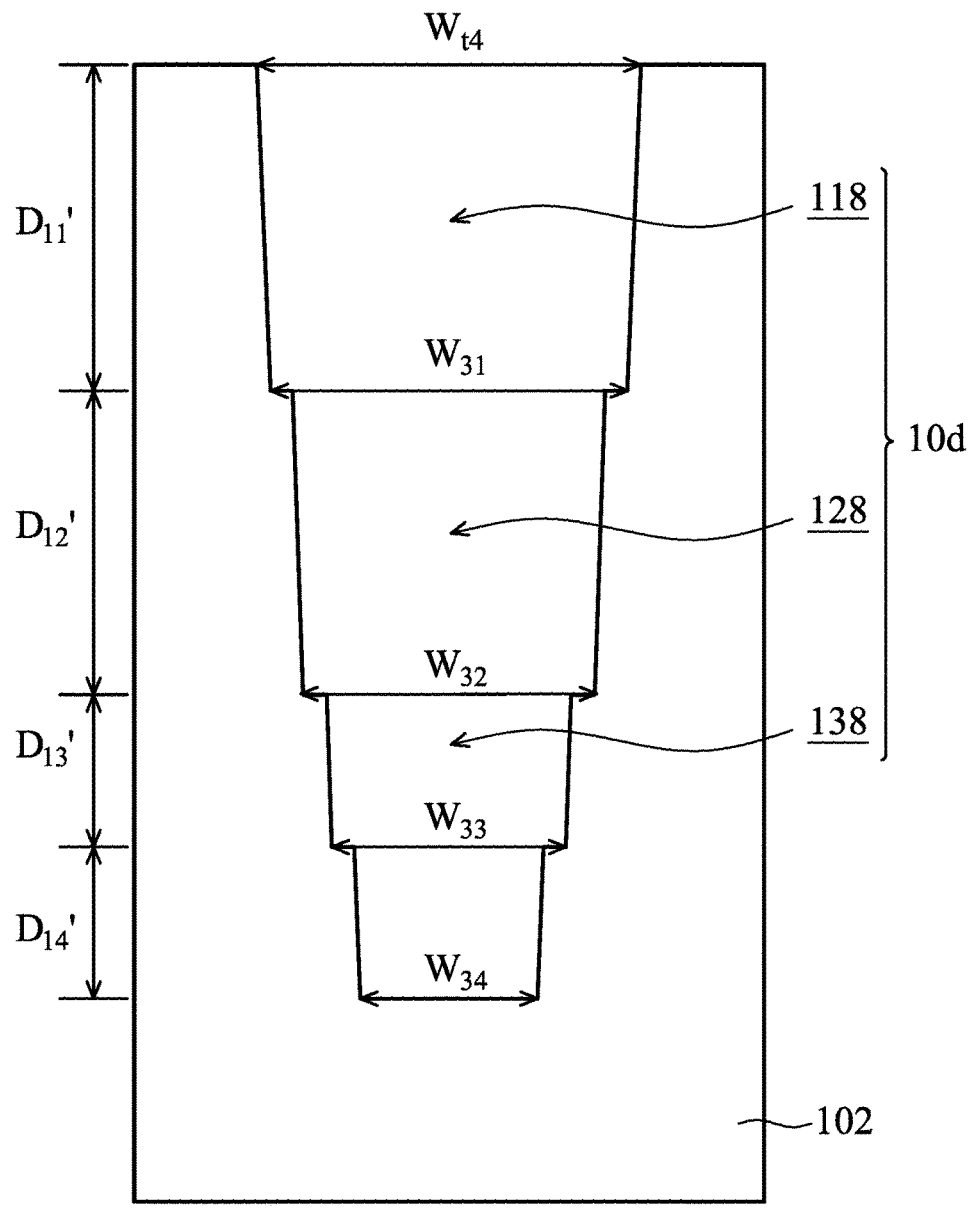

FIGS. 4A-4C show cross-sectional representations of various stages of forming a deep trench structure 10d, in accordance with some embodiments of the disclosure.

FIG. 4A shows other embodiments after the step of FIG. 2E. A third protective layer 140 is formed on sidewalls and the bottom surface of the third recess 138, in accordance with some embodiments of the disclosure. Compared with the first protective layer 120 and the second protective layer 130, the third protective layer 140 is formed far away from the first recess 118. The second protective layer 130 is formed between the first protective layer 120 and the third protective layer 140. In other words, the third protective layer 140 is formed in a deeper position than the first protective layer 120. In some embodiments, the third protective layer 140 is formed by an oxidation process, such as a thermal oxidation process, an in-situ steam generation (ISSG) process, or another applicable process.

Next, as shown in FIG. 4B, a portion of the substrate 102 below the third recess 138 is removed by using the hard mask layer 110 and the third protective layer 140 as a mask, in accordance with some embodiments of the disclosure. In addition, the top portion of the third protective layer 140 which is on the hard mask layer 110 is removed. As a result, a fourth recess 148 below the third recess 138 is obtained.

The fourth recess 148 has a fourth bottom surface 148b with a fourth width $W_{14}$ and a fourth depth $D_{14}$. The fourth depth $D_{14}$ is measured from a top surface of the substrate 102 to the bottom surface 148b of the fourth recess 148. The fourth recess 148 has opposite sidewalls, and the sidewalls are sloped to the bottom surface 148b.

Afterwards, as shown in FIG. 4C, the hard mask layer 110, the first protective layer 120, the second protective layer 130 and the third protective layer 140 are removed to form a deep trench structure 10d, in accordance with some embodiments of the disclosure.

After the first protective layer 120, the second protective layer 130 and the third protective layer 140 are removed, the first width of the first recess 118 is enlarged to have an enlarged first width $W_{31}$, the second width of the second recess 128 is enlarged to have an enlarged second width $W_{32}$, the third width of the third recess 138 is enlarged to have an enlarged third with $W_{33}$, and the fourth width of the fourth recess 148 is enlarged to have an enlarged fourth width $W_{34}$. The enlarged first width $W_{31}$ is greater than the first width $W_{21}$, the enlarged second width $W_{32}$ is greater than the second width $W_{22}$, and the enlarged third width $W_{33}$ is greater than the third width $W_{23}$ (width $W_{21}$, $W_{22}$ and $W_{23}$ are shown in FIG. 2G).

Furthermore, after the first protective layer 120 and the second protective layer 130 are removed, the first depth $D_{11}$ of the first recess 118 is elongated to have an elongated first depth $D_{11}'$, the second depth $D_{12}$ of the second recess 128 is elongated to have an elongated second depth $D_{12}'$. The third depth $D_{13}$ of the third recess 138 is elongated to have an elongated third depth $D_{13}'$, and the fourth depth $D_{14}$ of the fourth recess 148 is elongated to have an elongated fourth depth $D_{14}'$. In some embodiments, the ratio of the first depth $D_{11'}$, the second depth $D_{12'}$, the third depth $D_{13'}$ and the fourth depth $D_{14'}$ is about (2-4):(2-4):1:1.

The deep trench structure 10d has a top opening width $W_{t4}$. In some embodiments, the top opening width $W_{t4}$ of the deep trench structure 10d in FIG. 4C is greater than the top opening width $W_{t2}$ of the deep trench structure 10b in FIG. 2D12.

Figure 5A:
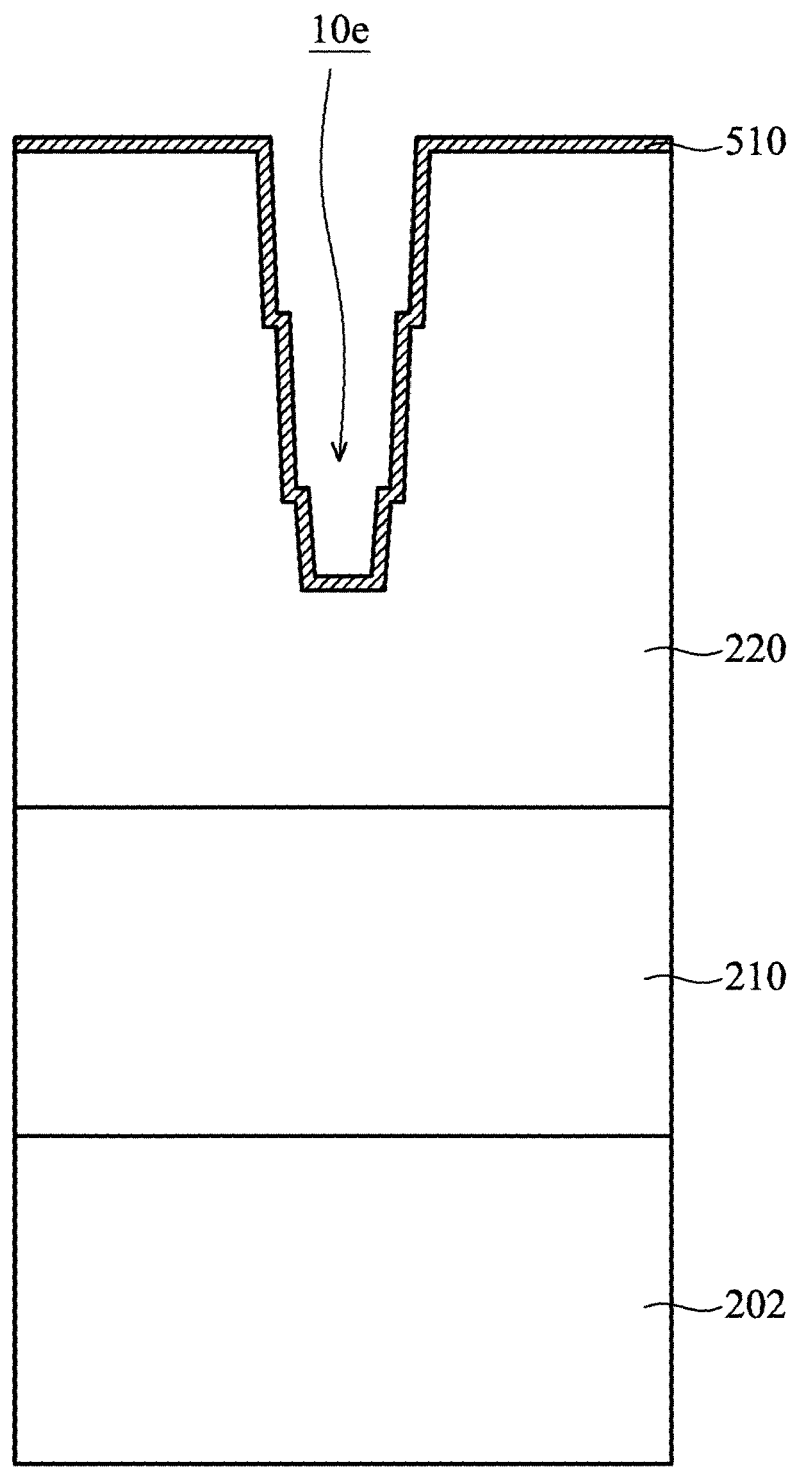
FIGS. 5A-5C show cross-sectional representations of various stages of forming a MIM (metal-insulation-metal) capacitor structure, in accordance with some embodiments of the disclosure.
Figure 5B:
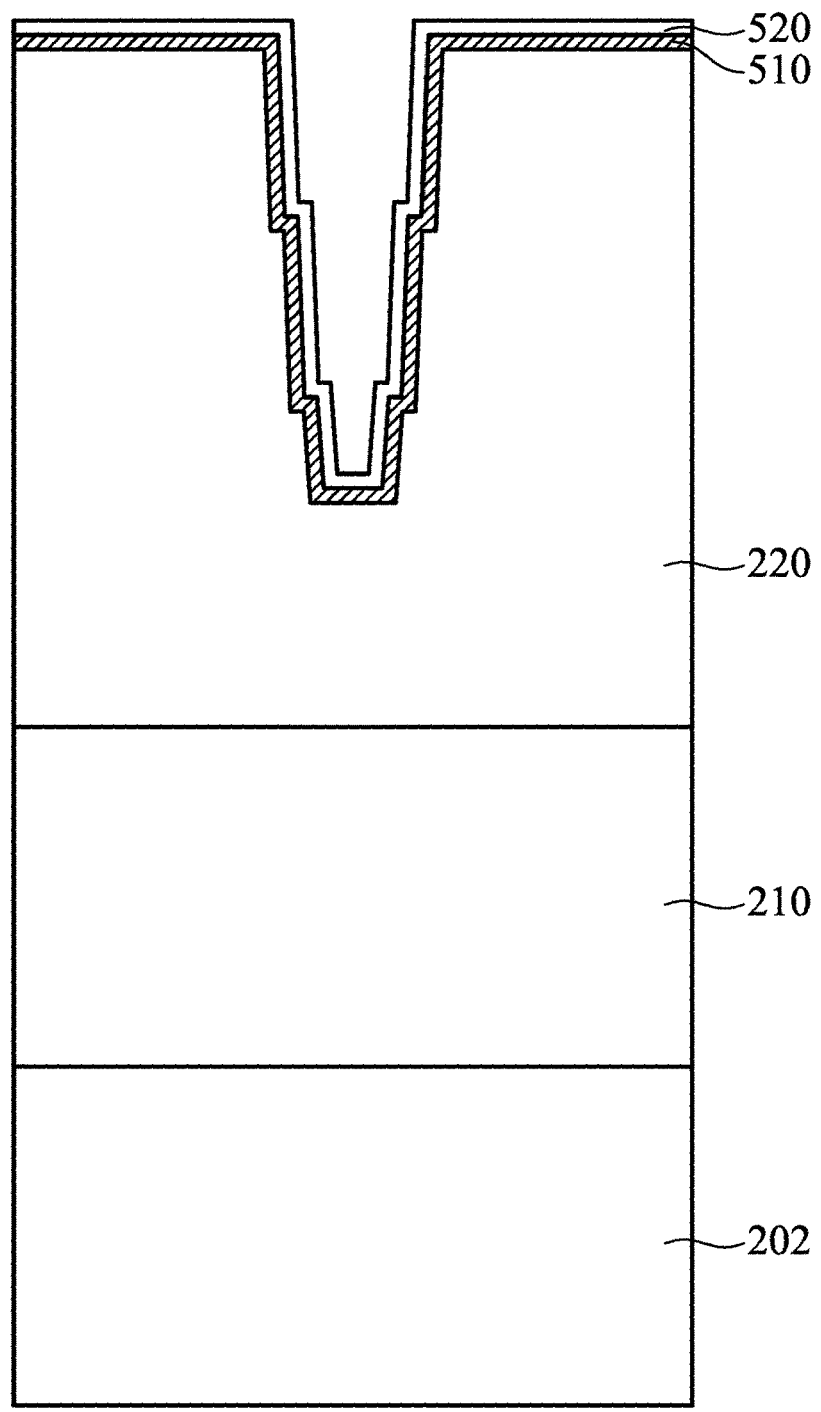
Figure 5C:
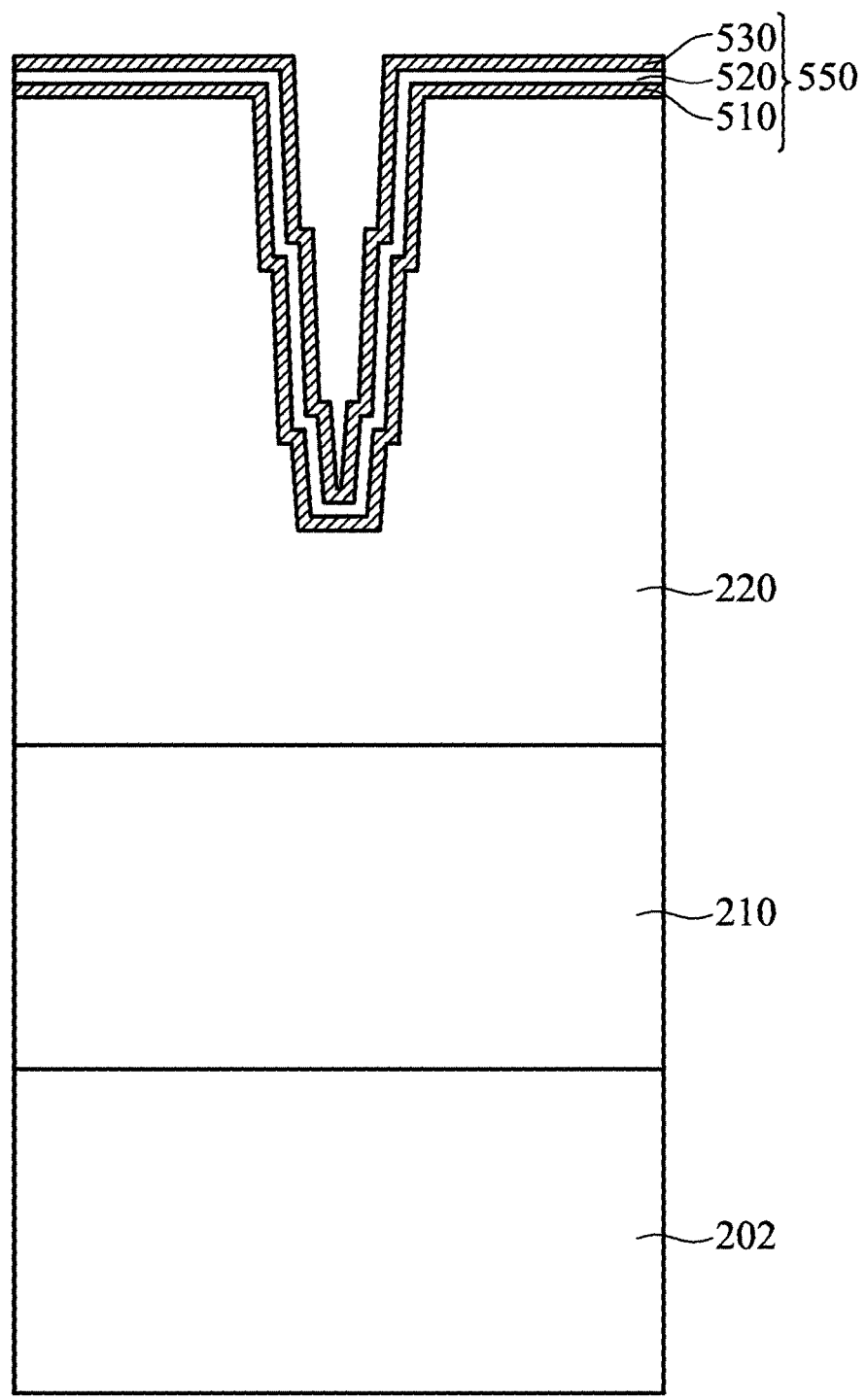

FIGS. 5A-5C show cross-sectional representations of various stages of forming a MIM (metal-insulation-metal) capacitor structure 550, in accordance with some embodiments of the disclosure.

As shown in FIG. 5A, a first dielectric layer 210 is formed over a substrate 202. A second dielectric layer 220 is formed over the first dielectric layer 210, and a deep trench structure 10e is formed in the second dielectric layer 220. The deep trench structure 10e has a tapered profile from top to bottom or has a stair shape.

The first dielectric layer 210 and the second dielectric layer 220 may be independently made of silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof. The first dielectric layer 210 and the second dielectric layer 220 may be formed by a deposition process, such as a chemical vapor deposition (CVD) process, a spin-on process, a sputtering process, or a combination thereof.

Some device elements may be formed in the first dielectric layer 210. The device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements. Various processes are performed to form device elements, such as deposition, etching, implantation, photolithography, annealing, and/or other applicable processes.

The second dielectric layer 220 and the deep trench structure 10e are formed in a back-end-of-line (BEOL) processing. In some embodiments, the deep trench structure 10e has three recesses (including the first recess 118, the second recess 128 and the third recess 138) and is formed by the processes shown in FIGS. 1A-1G or the processes shown in FIGS. 2A-2G. In some other embodiments, the deep trench structure 10e has four recesses (including the first recess 118, the second recess 128, the third recess 138 and the fourth recess 148) and is formed by the processes shown in FIGS. 3A-3C or the processes shown in FIGS. 4A-4C.

The first conductive layer 510 is formed in the stair-shaped deep trench structure 10e and on the second dielectric layer 220. The first conductive layer 510 is conformally formed on the sidewalls and bottom surface of the deep trench structure 10e, and thus the first conductive layer 510 follows the shape of the deep trench structure 10e to have a stair-shape.

The first conductive layer 510 may be made of a metal material, such as copper (Cu), copper alloy, aluminum (Al), aluminum (Al) alloy, copper aluminum alloy (AlCu), tungsten (W) or tungsten (W) alloy. The first conductive layer 510 may be formed by a deposition processes, such as chemical vapor deposition (CVD), physical vapor deposition (PVD), atomic layer deposition (ALD), or another applicable process.

Afterwards, as shown in FIG. 5B, an insulating layer 520 is formed over the first conductive layer 510. The insulating layer 520 is made of dielectric materials, such as silicon oxide, silicon nitride or silicon glass. In some embodiments, the insulating layer 520 is formed by chemical vapor deposition (CVD), physical vapor deposition (PVD), or another applicable process.

Next, as shown in FIG. 5C, a second conductive layer 530 is formed over the insulating layer 520. The MIM capacitor structure 550 is a sandwich structure and includes the insulating layer 520 between the first conductive layer 510 and the second conductive layer 530. The second conductive layer 530 may be made of a metal material, such as copper (Cu), copper alloy, aluminum (Al), aluminum (Al) alloy, copper aluminum alloy (AlCu), tungsten (W) or tungsten (W) alloy.

FIGS. 6A-6D show cross-sectional representations of various stages of forming a backside illuminated (BSI) image sensor device structure 600, in accordance with some embodiments of the disclosure.

Figure 6A:
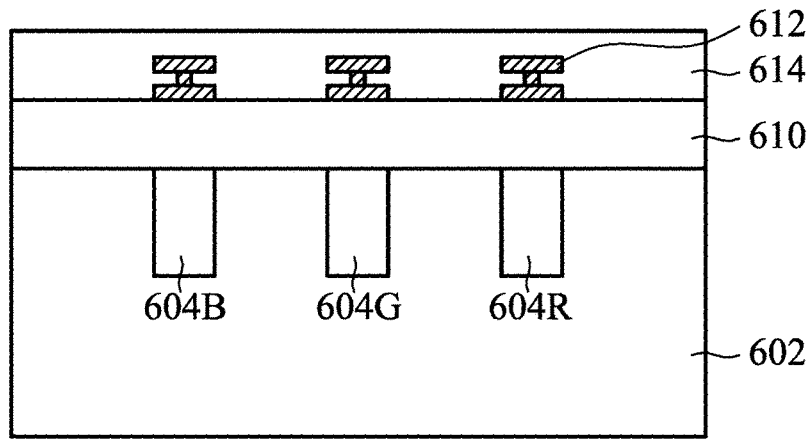
FIGS. 6A-6D show cross-sectional representations of various stages of forming a backside illuminated (BSI) image sensor device structure, in accordance with some embodiments of the disclosure.

As shown in FIG. 6A, a first dielectric layer 610 is formed over a substrate 602, and a second dielectric layer 614 is formed over the first dielectric layer 610. A number of pixel regions 604R, 604G and 604B are formed in the substrate 602. An interconnect structure 612 is formed in the second dielectric layer 614.

Figure 6B:
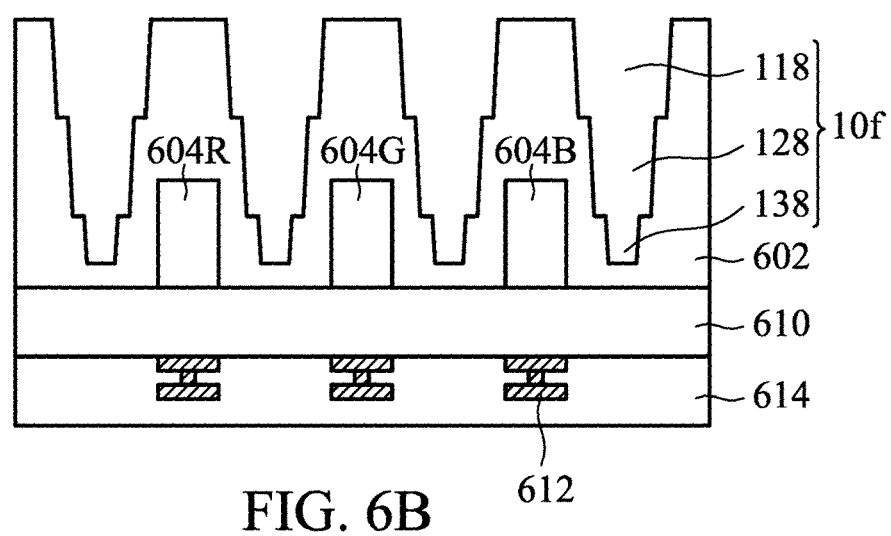

Afterwards, as shown in FIG. 6B, the substrate 602 is flipped, and a bottom surface of the substrate 602 faces up. A stair-shaped deep trench structure 10f is formed in the substrate 602. In some embodiments, the deep trench structure 10f has three recesses and is formed by the processes shown in FIGS. 1A-1G or the processes shown in FIGS. 2A-2G. In some other embodiments, the deep trench structure 10f has four recesses and is formed by the processes shown in FIGS. 3A-3C or the processes shown in FIGS. 4A-4C.

Figure 6C:
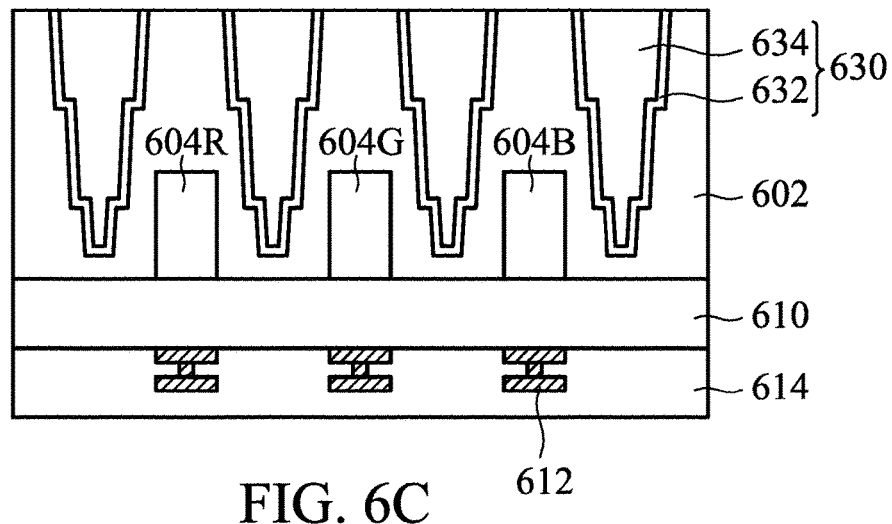

Next, as shown in FIG. 6C, a liner 632 is formed on sidewalls and a bottom surface of the deep trench structure 10f, and a filling material 634 is formed on the liner 632, in accordance with some embodiments of the disclosure. A deep trench isolation structure 630 is constructed by the liner 632 and the filling material 634. The deep trench isolation structure 630 is configured to reduce the cross-talk between two adjunct pixel regions 604R, 604G and 604B.

In some embodiments, the filling material 634 is made of a dielectric material. In some embodiments, the dielectric material is silicon oxide, silicon nitride, silicon oxynitride, a low-k dielectric material, or another applicable material. In some other embodiments, the filling material 634 is made of polyisilicon which has a better gap-filling capability than the dielectric materials. In some embodiments, the filling material 634 is made of two layers including dielectric layer and polyisilicon.

Figure 6D:
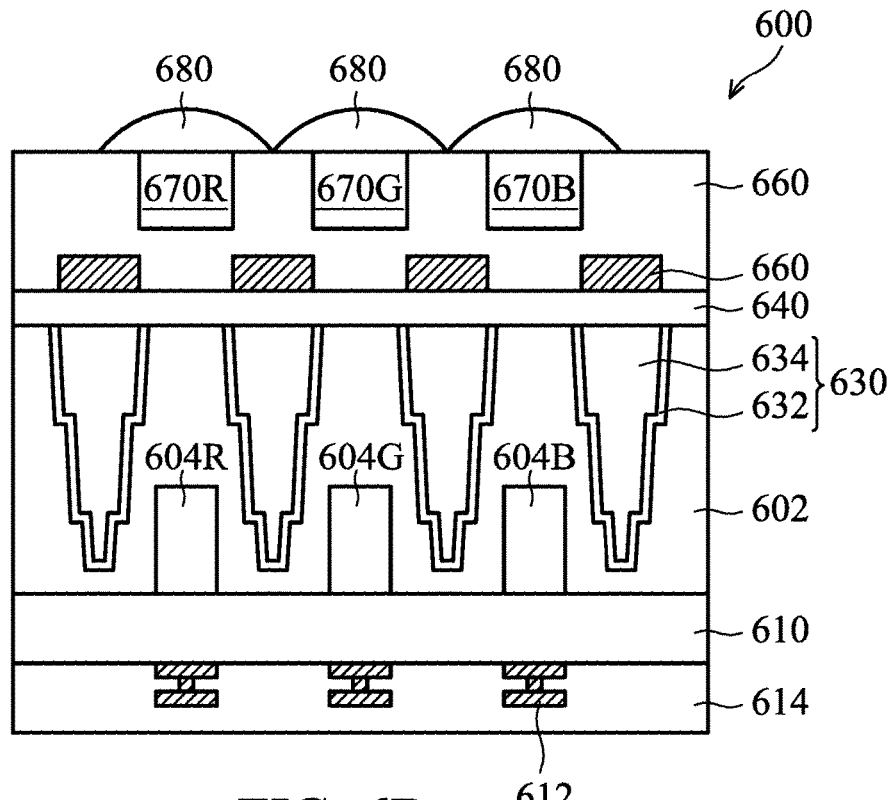

Afterwards, as shown in FIG. 6D, a passivation layer 640 is formed on the deep trench isolation structure 630, in accordance with some embodiments of the disclosure. A number of metal grids 650 are formed on the passivation layer 640. A third dielectric layer 660 is formed over the metal grids 650 and the passivation layer 640. A number of color filter layers 670R, 670G and 670B are formed in the third dielectric layer 660, and a number of microlens structures 680 are formed over the color filter layers 670R, 670G and 670B.

The deep trench structures are applied to a MIM capacitor structure or a backside illuminated (BSI) image sensor device structure. The deep trench structure may be formed by the process shown in FIGS. 1A-1G, FIGS. 2A-2G, FIGS. 3A-3C or FIGS. 4A-4C. The deep trench structure has a wider top width to facilitate the filling of the materials, and the sidewalls of the recesses are temporary protective layers to avoid the formation of undesirable bowing in the sidewall of the recesses. Furthermore, the defects caused by the etching process may be embedded in the protective layers, and therefore the defects may be removed along with the protective layers.

Embodiments for forming a deep trench structure are provided. A first recess is formed in a substrate, and a first protective layer is formed on sidewalls of the first recess. The first protective layer may be formed by a deposition process or an oxidation process. Afterwards, a second recess is formed by using the first protective layer as a mask, and a second protective layer is formed on sidewalls of the first protective layer. The second protective layer may be formed by a deposition process or an oxidation process. Afterwards, a third recess is formed by using the second protective layer as a mask, and the first protective layer and the second protective layer are removed. The first recess has a bottom surface with a first width, the second recess has a bottom surface with a second width, and the third recess has a bottom surface with a third recess. The third width is smaller than the second width, and the second width is smaller than the first width. A deep trench structure is constructed by the first recess, the second recess and the third recess, and has a stair shape.

The deep trench structure with a wider top width to facilitate the filling of the materials. In addition, the sidewalls of the recess are temporarily protected by the protective layers to avoid formation of unwanted bowing sidewall. When the filling materials are filled into the deep trench structure, it is easy to avoid leaving voids. The deep trench structure may be applied to various semiconductor devices, such as a MIM capacitor structure or a backside illuminated (BSI) image sensor device structure.

In some embodiments, a method for forming a deep trench structure is provided. The method includes forming a first recess in a top portion of a substrate and forming a first protective layer on sidewalls of the first recess. The method includes etching a middle portion of the substrate by using the first protective layer as a mask to form a second recess and forming a second protective layer on sidewalls of the second recess. The method also includes etching a bottom portion of the substrate by using the second protective layer as a mask to form a third recess; and removing the first protective layer and the second protective layer to form a deep trench structure. The deep trench structure is constructed by the first recess, the second recess, and the third recess, and the deep trench structure has a stair shape.

In some embodiments, a method for forming a deep trench structure is provided. The method includes forming a hard mask layer over a substrate and forming a first recess in the substrate by using the hard mask layer as mask. The first recess has a first bottom surface with a first width. The method includes forming a first protective layer on sidewalls of the first recess and removing a portion of the substrate below the first recess to form a second recess. The second recess has a second bottom surface with a second width smaller than the first width. The method further includes forming a second protective layer on sidewalls of the second recess and removing a portion of the substrate below the second recess to form a third recess. The third recess has a third bottom surface with a third width smaller than the second width. The method also includes removing the first protection layer and the second protection layer, such that a deep trench structure is constructed by the first recess, the second recess and the third recess, and the deep trench structure has a stair shape.

In some embodiments, a method for forming a deep trench structure is provided. The method includes forming a hard mask layer over a substrate and forming a first recess in the substrate by using the hard mask layer as a mask to expose a first portion of the substrate. The method includes oxidizing the first portion of the substrate to form a first protective layer lining sidewalls of the first recess and forming a second recess below the first recess by using the first protective layer as a mask to expose a second portion of the substrate. The method also includes oxidizing the second portion of the substrate to form a second protective layer lining sidewalls of the second recess and forming a third recess below the second recess by using the second protective layer as a mask to expose a third portion of the substrate. The method also includes removing the first protective layer and the second protective layer, such that a deep trench structure is constructed by the first recess, the second recess, and the third recess, and the deep trench structure has a stair shape.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a deep trench structure, comprising:
   forming a first recess in a top portion of a substrate;
   forming a first protective layer on sidewalls of the first recess;
   etching a middle portion of the substrate by using the first protective layer as a mask to form a second recess;
   forming a second protective layer on sidewalls of the second recess, wherein the second protective layer contacts the first protective layer, and the second protective layer is formed between the first protective layer and the substrate;
   etching a bottom portion of the substrate by using the second protective layer as a mask to form a third recess; and
   removing the first protective layer and the second protective layer to form a deep trench structure, wherein the deep trench structure is constructed by the first recess, the second recess and the third recess, and the deep trench structure has a stair shape.

2. The method for forming the deep trench structure as claimed in claim 1, further comprising:
   forming a mask layer over the substrate before forming the first recess in the top portion of the substrate, wherein forming the mask layer comprises:
      forming a first oxide mask layer over the substrate;
      forming a nitride mask layer over the first oxide mask layer; and
      forming a second oxide mask layer over the nitride layer.

3. The method for forming the deep trench structure as claimed in claim 1, further comprising:
   forming a first conductive layer on sidewalls and a bottom surface of the deep trench structure, wherein the conductive layer has a stair shape;
   forming an insulator layer on the first conductive layer; and
   forming a second conductive layer on the insulator layer.

4. The method for forming the deep trench structure as claimed in claim 1, further comprising:
   forming a pixel region in the substrate;
   conformally forming a liner layer on sidewalls and a bottom surface of the deep trench structure, wherein the liner layer has a stair shape; and
   forming a filling material on the liner layer.

5. A method for forming a deep trench structure, comprising:
   forming a hard mask layer over a substrate;
   forming a first recess in the substrate by using the hard mask layer as mask, wherein the first recess has a first bottom surface with a first width;
   forming a first protective layer on sidewalls of the first recess;
   removing a portion of the substrate below the first recess to form a second recess, wherein the second recess has a second bottom surface with a second width smaller than the first width;
   forming a second protective layer on sidewalls of the second recess, wherein the second protective layer is formed on sidewalls of the first protective layer;
   removing a portion of the substrate below the second recess to form a third recess, wherein the third recess has a third bottom surface with a third width smaller than the second width, and the sidewalls of the first protective layer are covered by the second protective layer after the third recess is formed; and
   removing the first protection layer and the second protection layer, such that a deep trench structure is constructed by the first recess, the second recess and the third recess, and the deep trench structure has a stair shape.

6. The method for forming the deep trench structure as claimed in claim 5, further comprising:
   forming a third protective layer on sidewalls of the third recess;
   removing a portion of the substrate below the third recess to form a fourth recess, wherein the fourth recess has a fourth bottom surface with a fourth width smaller than the third width before the step of removing the first protection layer and the second protection layer.

7. The method for forming the deep trench structure as claimed in claim 5, wherein removing the first protection layer and the second protection layer further comprises:
   removing a portion of the hard mask layer to expose a top surface of the substrate.

8. The method for forming the deep trench structure as claimed in claim 5, wherein forming the hard mask layer over the substrate comprises:
   forming a first oxide mask layer over the substrate;
   forming a nitride mask layer over the first oxide mask layer; and
   forming a second oxide mask layer over the nitride layer.

9. The method for forming the deep trench structure as claimed in claim 8, wherein the first protection layer and the second protection layer are made of oxide, and when the step of removing the first protection layer and the second protection layer is performed, a portion of the first oxide mask layer is simultaneously removed.

10. The method for forming the deep trench structure as claimed in claim 8, wherein the first protection layer and the second protection layer are made of nitride, and when the step of removing the first protection layer and the second protection layer is performed, a portion of the nitride mask layer are simultaneously removed.

11. The method for forming the deep trench structure as claimed in claim 5, further comprising:
   forming a pixel region in the substrate;
   conformally forming a liner layer on sidewalls and a bottom surface of the deep trench structure, wherein the liner layer has a stair shape; and
   forming a filling material on the liner layer.

12. The method for forming the deep trench structure as claimed in claim 5, further comprising:
   forming a first conductive layer on sidewalls and a bottom surface of the deep trench structure, wherein the conductive layer has a stair shape;
   forming an insulator layer on the first conductive layer; and
   forming a second conductive layer on the insulator layer.

13. The method for forming the deep trench structure as claimed in claim 5, wherein an interface between the first protective layer and the second protective layer is covered by the hard mask layer.

14. A method for forming a deep trench structure, comprising:
   forming a hard mask layer over a substrate;
   forming a first recess in the substrate by using the hard mask layer as a mask to expose a first portion of the substrate;
   oxidizing the first portion of the substrate to form a first protective layer lining sidewalls of the first recess;
   forming a second recess below the first recess by using the first protective layer as a mask to expose a second portion of the substrate;
   oxidizing the second portion of the substrate to form a second protective layer lining sidewalls of the second recess;
   forming a third recess below the second recess by using the second protective layer as a mask to expose a third portion of the substrate; and
   removing the first protective layer and the second protective layer, such that a deep trench structure is constructed by the first recess, the second recess and the third recess, and the deep trench structure has a stair shape.

15. The method for forming the deep trench structure as claimed in claim 14, further comprising:
   oxidizing the third portion of the substrate to form a third protective layer lining sidewalls of the third recess; and
   forming a fourth recess below the third recess by using the third protective layer as a mask before the step of removing the first protective layer and the second protective layer.

16. The method for forming the deep trench structure as claimed in claim 14, wherein removing the first protective layer and the second protective layer further comprises:
   removing a portion of the hard mask layer to expose a top surface of the substrate.

17. The method for forming the deep trench structure as claimed in claim 14, wherein oxidizing the second portion of the substrate to form the second protective layer further comprises:
   oxidizing a portion of the substrate covered by the first protective layer to form an extended second protective layer, wherein the extended second protective layer is extended away from the first recess in a horizontal direction.

18. The method for forming the deep trench structure as claimed in claim 14, wherein oxidizing the second portion of the substrate to form the second protective layer further comprises:
   oxidizing a portion of the hard mask layer.

19. The method for forming the deep trench structure as claimed in claim 14, further comprising:
   forming a pixel region in the substrate;
   conformally forming a liner layer on sidewalls and a bottom surface of the deep trench structure, wherein the liner layer has a stair shape;
   forming a filling material on the liner layer to a deep trench isolation structure, wherein the deep trench isolation structure has a stair shape; and
   forming a metal grid over the deep trench isolation structure.

20. The method for forming the deep trench structure as claimed in claim 14, further comprising:
   forming a first conductive layer on sidewalls and a bottom surface of the deep trench structure, wherein the conductive layer has a stair shape;
   forming an insulator layer on the first conductive layer; and
   forming a second conductive layer on the insulator layer.

* * * * *